(12) United States Patent
Han et al.

(10) Patent No.: US 12,077,847 B2
(45) Date of Patent: Sep. 3, 2024

(54) APPARATUS AND METHOD FOR MANUFACTURING DISPLAY APPARATUS

(71) Applicant: Samsung Display Co., Ltd., Yongin-Si (KR)

(72) Inventors: Sangjin Han, Yongin-si (KR); Junha Park, Yongin-si (KR); Myungsoo Huh, Yongin-si (KR); Cheollae Roh, Yongin-si (KR); Seongho Jeong, Yongin-si (KR)

(73) Assignee: Samsung Display Co., Ltd., Yongin-Si (KR)

( * ) Notice: Subject to any disclaimer, the term of this patent is extended or adjusted under 35 U.S.C. 154(b) by 106 days.

(21) Appl. No.: 16/354,006

(22) Filed: Mar. 14, 2019

(65) Prior Publication Data
US 2020/0024724 A1    Jan. 23, 2020

(30) Foreign Application Priority Data

Jul. 20, 2018  (KR) .......................... 10-2018-0084768

(51) Int. Cl.
*C23C 14/00*   (2006.01)
*C23C 14/04*   (2006.01)
*C23C 14/24*   (2006.01)

(52) U.S. Cl.
CPC .......... *C23C 14/243* (2013.01); *C23C 14/042* (2013.01)

(58) Field of Classification Search
CPC .......... C23C 14/00; C23C 16/00; H01L 51/00
See application file for complete search history.

(56) References Cited

U.S. PATENT DOCUMENTS

| | | | | |
|---|---|---|---|---|
| 4,579,083 A | * | 4/1986 | Boivin | C23C 14/22 |
| | | | | 118/664 |
| 5,906,857 A | * | 5/1999 | McKee | C23C 14/542 |
| | | | | 118/712 |
| 6,183,817 B1 | * | 2/2001 | Gersonde | G21K 5/04 |
| | | | | 427/595 |

(Continued)

FOREIGN PATENT DOCUMENTS

| | | |
|---|---|---|
| CN | 1458811 A | 11/2003 |
| JP | 2011-068980 A | 4/2011 |

(Continued)

OTHER PUBLICATIONS

JP 2014-162969A Google Patents (Year: 2014).*

(Continued)

*Primary Examiner* — Kelly M Gambetta
*Assistant Examiner* — Mohammad Mayy
(74) *Attorney, Agent, or Firm* — Innovation Counsel LLP

(57) ABSTRACT

An apparatus for manufacturing a display apparatus includes a chamber configured to accommodate a first display substrate and a second display substrate therein, a deposition source positioned in the chamber and comprising a plurality of crucibles configured to move and supply at least two deposition materials to the first display substrate or the second display substrate, a mask assembly arranged between the first display substrate or the second display substrate and the deposition source, and a shutter portion arranged between the mask assembly and the deposition source and configured to control an amount of the at least two deposition materials supplied from the plurality of crucibles.

13 Claims, 10 Drawing Sheets

(56) References Cited

U.S. PATENT DOCUMENTS

| | | | |
|---|---|---|---|
| 8,206,507 | B2 | 6/2012 | Yamazaki et al. |
| 8,802,488 | B2 | 8/2014 | Yi et al. |
| 8,974,858 | B2 | 3/2015 | Park et al. |
| 2004/0031442 | A1* | 2/2004 | Yamazaki ............ H01L 51/001 118/727 |
| 2004/0144321 | A1* | 7/2004 | Grace et al. ............ C23C 16/00 118/726 |
| 2008/0173241 | A1* | 7/2008 | Priddy ................. C23C 14/542 392/389 |
| 2011/0132260 | A1* | 6/2011 | Yamazaki ......... H01L 21/67745 118/719 |
| 2012/0064728 | A1 | 3/2012 | Yi et al. |
| 2014/0014921 | A1* | 1/2014 | Choi ...................... H01L 51/52 257/40 |
| 2015/0030761 | A1* | 1/2015 | Kato ...................... C23C 14/56 427/8 |
| 2016/0296961 | A1 | 10/2016 | Pahk |
| 2017/0226627 | A1* | 8/2017 | Jin ......................... C23C 14/54 |

FOREIGN PATENT DOCUMENTS

| | | | | |
|---|---|---|---|---|
| JP | 2014162969 | A | * | 9/2014 |
| KR | 10-2012-0028627 | A | | 3/2012 |
| KR | 10-2014-0010303 | A | | 1/2014 |
| KR | 10-1405067 | B1 | | 6/2014 |
| KR | 10-2014-0145383 | A | | 12/2014 |
| KR | 10-2015-0029146 | A | | 3/2015 |
| KR | 10-2015-0130841 | A | | 11/2015 |
| KR | 10-2016-0037671 | A | | 4/2016 |
| KR | 10-2017-0007545 | A | | 1/2017 |
| KR | 10-1769953 | B1 | | 8/2017 |
| KR | 10-2017-0139699 | A | | 12/2017 |
| KR | 10-2018-0037277 | A | | 4/2018 |
| WO | 2017-121491 | A1 | | 7/2017 |
| WO | 2017-194098 | A1 | | 11/2017 |
| WO | WO-2017194098 | A1 | * | 11/2017 ............. C23C 14/24 |
| WO | 2015-086049 | A1 | | 6/2018 |

OTHER PUBLICATIONS

"Handbook of Deposition Technologies for Films and Coatings, Science, Technology and Applications", Rointan F. Bunshah, 2nd Ed, Noyes Publications, pp. 157-170, (Year: 1994).*

* cited by examiner

US 12,077,847 B2

APPARATUS AND METHOD FOR MANUFACTURING DISPLAY APPARATUS

CROSS-REFERENCE TO RELATED APPLICATION

This application claims the benefit of Korean Patent Application No. 10-2018-0084768, filed on Jul. 20, 2018, in the Korean Intellectual Property Office, the disclosure of which is incorporated herein in its entirety by reference.

BACKGROUND

1. Field

One or more embodiments relate to apparatuses and methods, and more particularly, to apparatuses for manufacturing a display apparatus and methods of manufacturing a display apparatus.

2. Description of the Related Art

Mobility based electronic devices have been widely used. In addition to compact electronic devices such as mobile phones, tablet personal computers (PCs) have been widely used as mobile electronic devices.

To support various functions, mobile electronic devices include display devices enabling use with visual information such as images or video. As other parts for driving a display apparatus have been miniaturized, the size of the display apparatus in an electronic device has gradually increased, a structure capable of bending a display apparatus in a flat state to a certain angle has been developed.

Various equipment may be used for manufacturing a display apparatus. An intermediate layer may be manufactured by using a plurality of deposition materials. In this case, the deposition order of deposition materials, the concentration of a deposition material during stacking, and a mixing ratio between respective deposition materials may greatly affect the performance of a display apparatus.

SUMMARY

One or more embodiments include apparatuses for manufacturing a display apparatus and methods of manufacturing a display apparatus.

Additional aspects will be set forth in part in the description which follows and, in part, will be apparent from the description, or may be learned by practice of the presented embodiments.

According to one or more embodiments, an apparatus for manufacturing a display apparatus includes a chamber, a deposition source, a mask assembly, and a shutter portion. The chamber may be configured to accommodate a first display substrate and a second display substrate therein. The deposition source may be positioned in the chamber and comprises a plurality of crucibles configured to move and supply at least two deposition materials to the first display substrate or the second display substrate. The mask assembly may be arranged between the first display substrate or the second display substrate and the deposition source. The shutter portion may be arranged between the mask assembly and the deposition source and may be configured to control an amount of the at least two deposition materials supplied from the plurality of crucibles.

The first display substrate and the second display substrate may be arranged perpendicular to a lower surface of the chamber.

The first display substrate and the second display substrate may be arranged to face each other in the chamber.

The shutter portion may be configured perform a linear motion.

The shutter portion may be disposed adjacent to each of the plurality of crucibles and may be configured to perform a pivot motion.

The apparatus may further include an angle limiting plate arranged in the deposition source and configured to limit an ejection angle of a deposition material ejected from at least one of the plurality of crucibles.

The deposition source may be positioned in the chamber and configured to perform a linear motion.

According to one or more embodiments, an apparatus for manufacturing a display apparatus includes a chamber, a deposition source, a mask assembly, a plurality of deposition material supply portions, and a cut-off portion. The chamber may be configured to accommodate a first display substrate and a second display substrate therein. The deposition source may be positioned in the chamber and includes a plurality of crucibles configured to move and supply at least two deposition materials to the first display substrate or the second display substrate. The mask assembly may be arranged between the first display substrate or the second display substrate and the deposition source. The plurality of deposition material supply portions may be respectively connected to the plurality of crucibles and be configured to separately supply a deposition material to each of the plurality of crucibles. The cut-off portion may be arranged between each of the plurality of crucibles and each of the plurality of deposition material supply portions and be configured to control an amount of the deposition material supplied from each of the plurality of crucibles and each of the plurality of deposition material supply portions.

The first display substrate and the second display substrate may be arranged perpendicular to a lower surface of the chamber.

According to one or more embodiments, a method of manufacturing a display apparatus include arranging a first display substrate and a second display substrate in a chamber. A mask assembly is arranged to correspond to each of the first display substrate and the second display substrate. The mask assembly corresponding to one of the first display substrate and the second display substrate is aligned with one of the first display substrate and the second display substrate. At least two deposition materials are supplied to the mask assembly through a deposition source including a plurality of crucibles. The at least two deposition materials having passed through the mask assembly are allowed to be deposited on one of the first display substrate and the second display substrate. An amount of the at least two deposition materials is adjusted by controlling an amount of a deposition material ejected from each of the plurality of crucibles through a shutter portion or by controlling an amount of a deposition material supplied to each of the plurality of crucibles through a cut-off portion.

The deposition material may be deposited on at least one of the first display substrate and the second display substrate that are arranged perpendicular to a lower surface of the chamber.

The first display substrate and the second display substrate may be arranged to face each other.

The shutter portion may be arranged between the mask assembly and the deposition source and may perform a linear motion.

A plurality of deposition material supply portions for separately supplying a deposition material to each of the plurality of crucibles may be connected to the deposition source. The cut-off portion may control an amount of the deposition material supplied from each of the plurality of deposition material supply portions to each of the plurality of crucibles.

The deposition source may perform a linear motion.

While the at least two deposition materials are deposited on one of the first display substrate and the second display substrate, the other of the first display substrate and the second display substrate may be positionally aligned with the mask assembly.

The shutter portion may be disposed adjacent to the deposition source and may perform a rotation motion.

At least one of the plurality of crucibles may have a limited ejection angle of the deposition material ejected therefrom.

The at least two deposition materials may be deposited on the other of the first display substrate and the second display substrate by changing a direction of the deposition source.

The at least two deposition materials may be different materials from each other.

BRIEF DESCRIPTION OF THE DRAWINGS

These and/or other aspects will become apparent and more readily appreciated from the following description of the embodiments, taken in conjunction with the accompanying drawings in which.

DETAILED DESCRIPTION

Figure 1:
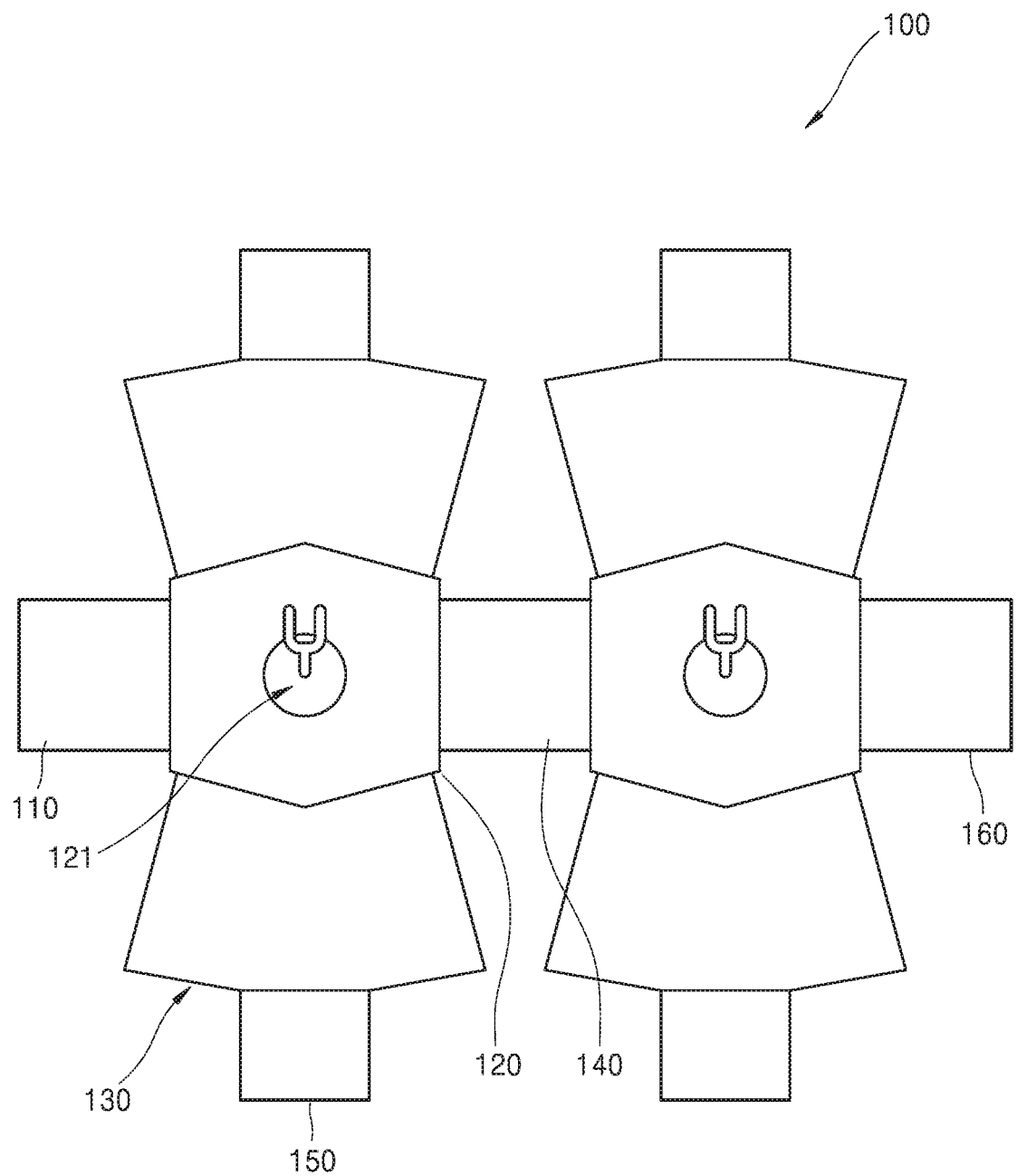
FIG. 1 is a plan view of an apparatus for manufacturing a display apparatus according to an embodiment.

As the disclosure allows for various changes and numerous embodiments, embodiments will be illustrated in the drawings and described in detail in the written description. However, this is not intended to limit the present disclosure to particular modes of practice, and it is to be appreciated that all changes, equivalents, and substitutes that do not depart from the spirit and technical scope of the present disclosure are encompassed in the present disclosure. In the description of the present disclosure, certain detailed explanations of the related art are omitted when it is deemed that they may unnecessarily obscure the essence of the disclosure.

Hereinafter, the present disclosure will be described in detail by explaining embodiments of the disclosure with reference to the attached drawings. Like reference numerals in the drawings denote like elements, and redundant descriptions are omitted.

While such terms as "first," "second," etc., may be used to describe various components, such components must not be limited to the above terms As used herein, the singular forms "a," "an" and "the" are intended to include the plural forms as well, unless the context clearly indicates otherwise.

It will be further understood that the terms "comprises" and/or "comprising" used herein specify the presence of stated features or components, but do not preclude the presence or addition of one or more other features or components.

It will be understood that when a layer, region, or component is referred to as being "formed on" another layer, region, or component, it can be directly or indirectly formed on the other layer, region, or component. That is, for example, intervening layers, regions, or components may be present.

Sizes of components in the drawings may be exaggerated for convenience of explanation. In other words, since sizes and thicknesses of components in the drawings are arbitrarily illustrated for convenience of explanation, the following embodiments are not limited thereto.

When a certain embodiment may be implemented differently, a specific process order may be performed differently from the described order. For example, two consecutively described processes may be performed substantially at the same time or performed in an order opposite to the described order.

It will be understood that when a layer, region, or component is referred to as being "connected to" another layer, region, or component, it can be directly connected to the other layer, region, or component or indirectly connected to the other layer, region, or component via intervening layers, regions, or components. For example, in the present specification, when a layer, region, or component is referred to as being electrically connected to another layer, region, or component, it can be directly electrically connected to the other layer, region, or component or indirectly electrically connected to the other layer, region, or component via intervening layers, regions, or components.

Figure 2:
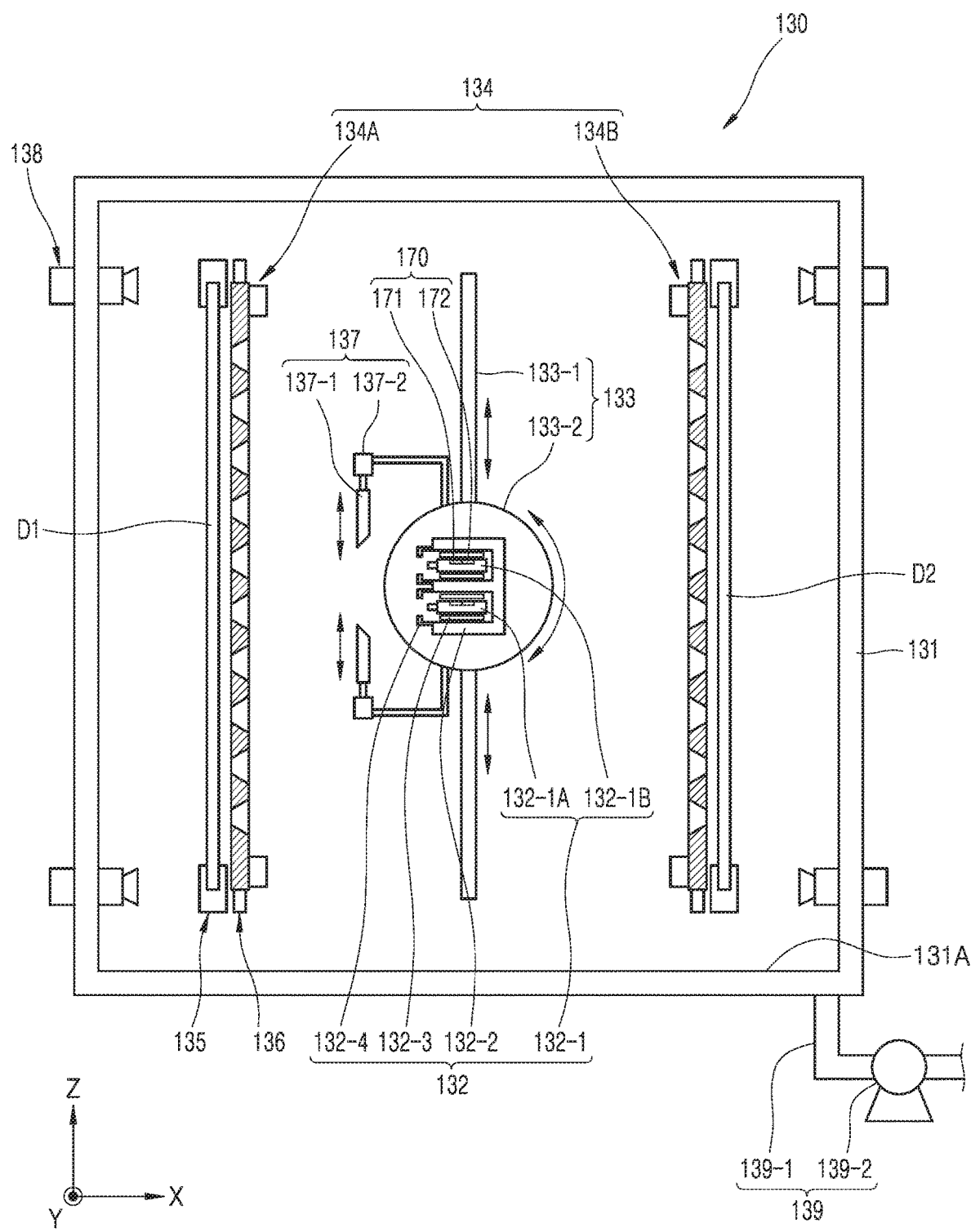
FIG. 2 is a cross-sectional view of a first display substrate, a second display substrate, a deposition source, a mask assembly, and a shutter portion, which are arranged in a deposition chamber of FIG. 1.
Figure 3A:
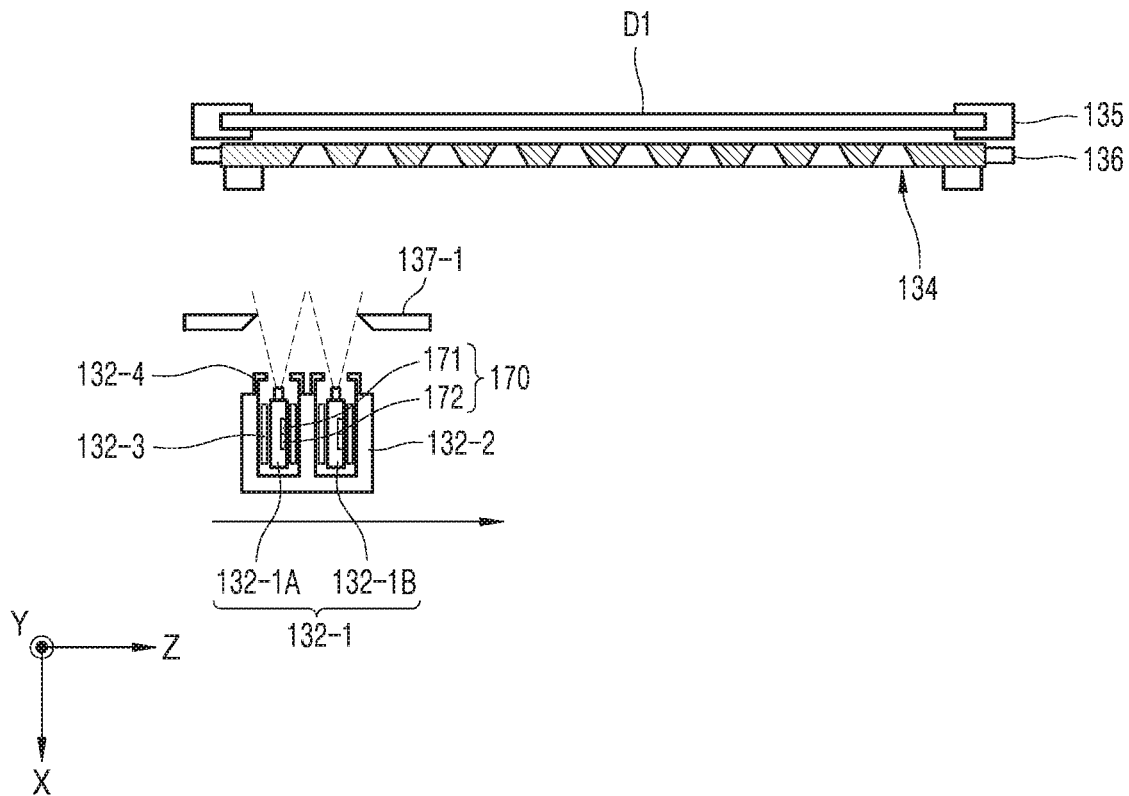
FIGS. 3A, 3B, and 3C are plan views illustrating operations of the deposition source and the shutter portion of FIG. 2.
Figure 3B:
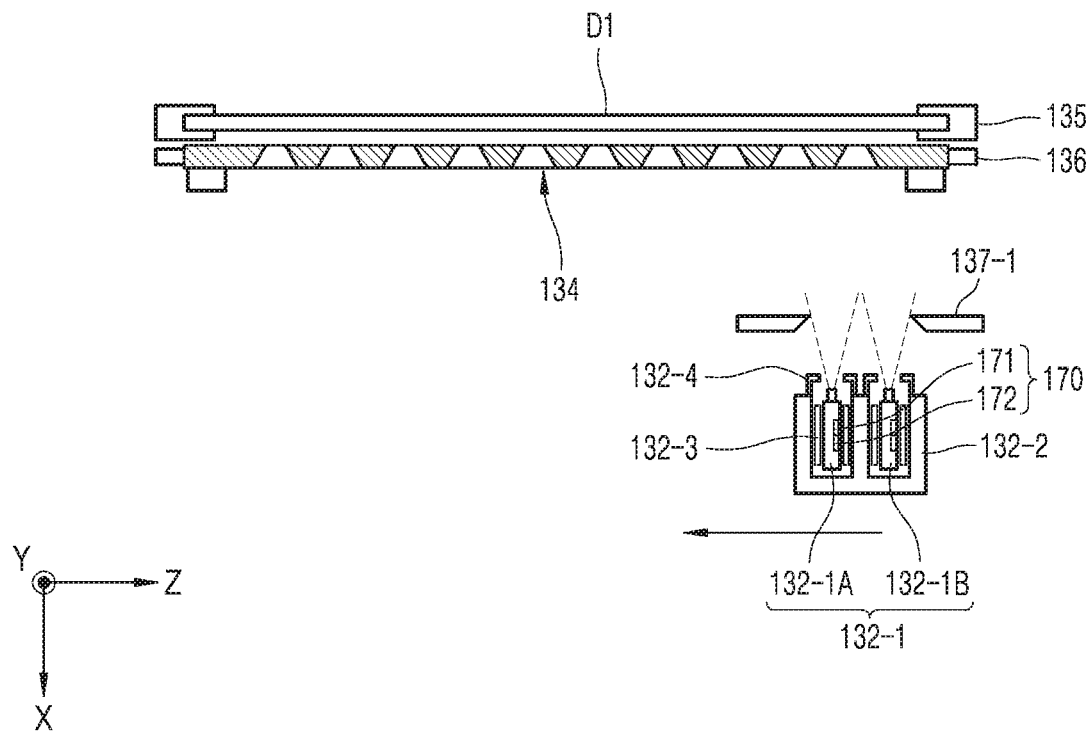
Figure 3C:
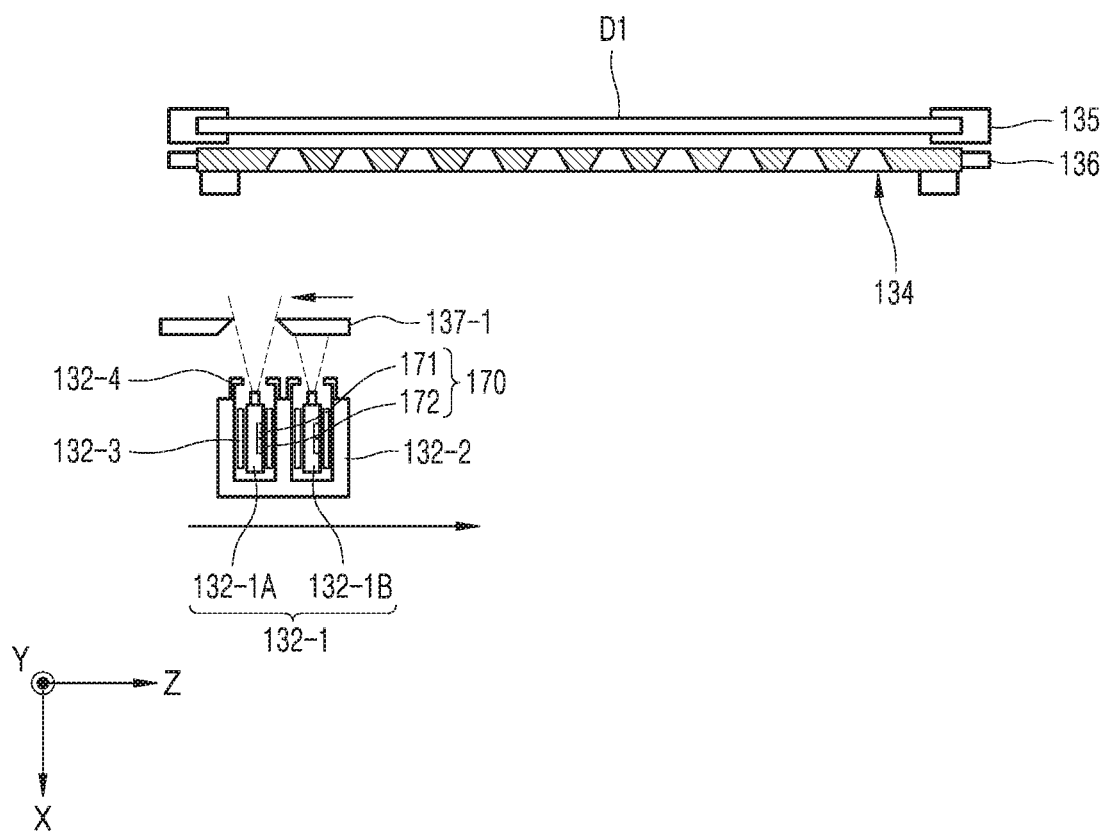

FIG. 1 is a plan view of an apparatus 100 for manufacturing a display apparatus according to an embodiment. FIG. 2 is a cross-sectional view of a first display substrate D1, a second display substrate D2, a deposition source 132, a mask assembly 134, and a shutter portion 137, which are arranged in a deposition chamber of FIG. 1. FIGS. 3A to 3C are plan views illustrating operations of the deposition source 132 and the shutter portion 137 of FIG. 2.

Referring to FIGS. 1 through 3C, the apparatus 100 for manufacturing a display apparatus may include a loading portion 110, a transfer portion 120, a deposition portion 130, a connection portion 140, an unloading portion 160, and a sensor portion 170.

The loading portion 110 may accommodate at least one of a plurality of display substrates (not shown) supplied from the outside. In this state, the display substrate may be accommodated in the loading portion 110 after the pressure of the loading portion 110 is maintained the same as the atmospheric pressure. When the display substrate is moved to the transfer portion 120, the internal pressure of the loading portion 110 may be maintained the same as the internal pressure of the transfer portion 120.

The transfer portion 120 may move the display substrate from the loading portion 110 to the deposition portion 130. In this state, the transfer portion 120 may move the display substrate in various ways. For example, the apparatus 100 for manufacturing a display apparatus may be provided with a shuttle capable of moving inside the apparatus 100 for manufacturing a display apparatus, and the display substrate may be moved by being accommodated on the shuttle.

In another embodiment, the transfer portion 120 may include a robot arm 121, on which the display substrate is held, and move the display substrate. In another embodiment, the apparatus 100 for manufacturing a display apparatus may move the display substrate by using the shuttle moving between parts of the apparatus 100 for manufacturing a display apparatus and the robot arm 121 provided in the transfer portion 120.

In this state, the apparatus 100 for manufacturing a display apparatus is not limited to the above structures and the display substrate may be moved through a variety of apparatuses and structures. In the following description, for convenience of explanation, a case in which the apparatus 100 for manufacturing a display apparatus includes the robot arm 121 and the shuttle is mainly described in detail.

The deposition portion 130 may be connected to the transfer portion 120, in which the display substrate is accommodated and deposition may be performed on the display substrate. In this state, the deposition portion 130 may include a plurality of deposition portions connected to the transfer portion 120. In each deposition portion 130, the same deposition material may be deposited on the display substrate or different deposition materials may be deposited on the display substrate.

The deposition portion 130 may include a chamber 131, the deposition source 132, a deposition source driving portion 133, the mask assembly 134, a substrate holder 135, a mask holder 136, the shutter portion 137, a vision portion 138, and a pressure regulation portion 139.

The chamber 131 may have a space therein. The chamber 131 may be connected directly to the transfer portion 120 or connected via another separate chamber. In the following description, for convenience of explanation, a case in which the chamber 131 is connected directly to the transfer portion 120 is mainly described in detail. A portion of the chamber 131 that is connected to the transfer portion 120 may be opened.

In this state, a gate valve (not shown) is provided at the open portion of the chamber 131 to selectively open or close the open portion of the chamber 131. The first display substrate D1 and the second display substrate D2 may be arranged in the chamber 131. In this case, the first display substrate D1 and the second display substrate D2 may be arranged to face each other, and the first display substrate D1 and the second display substrate D2 may be arranged perpendicular to a lower surface 131A of the chamber 131. In particular, the first display substrate D1 and the second display substrate D2 may be arranged in the chamber 131 standing in a height direction of the chamber 131.

The deposition source 132 may be provided in the chamber 131. In this state, the deposition source 132 may move relative to one of the first display substrate D1 and the second display substrate D2. For example, when the deposition source 132 moves linearly, the first display substrate D1 and/or the second display substrate D2 may remain unmoved. In another embodiment, when the deposition source 132 is stopped, the first display substrate D1 and/or the second display substrate D2 may move linearly. In another embodiment, while the deposition source 132 moves linearly, the first display substrate D1 and/or the second display substrate D2 may move linearly. In the following description, for convenience of explanation, a case in which only the deposition source 132 moves linearly is mainly described in detail.

The deposition source 132 described above may include a single deposition source or a plurality of deposition sources. In this state, when the deposition source 132 includes a plurality of deposition sources, each deposition source 132 may include one crucible 132-1 or a plurality of crucibles 132-1 for accommodating and supplying one deposition material. In another embodiment, when the deposition source 132 includes a single deposition source, the deposition source 132 may include a plurality of crucibles 132-1 for accommodating and supplying one deposition material.

In this state, each of the crucibles 132-1 may include a first crucible 132-1A for accommodating and supplying a first deposition material and a second crucible 132-1B for accommodating and supplying a second deposition material. In the following description, for convenience of explanation, a case in which the deposition source 132 includes only one deposition source and the deposition source 132 includes a plurality of crucibles 132-1 is mainly described in detail. In this state, each of the crucibles 132-1 may include a nozzle for guiding and ejecting a deposition material to the outside.

The deposition source 132 may include the crucibles 132-1 for accommodating at least two deposition materials, a cooling jacket 132-2 encompassing an outer side of each of the crucibles 132-1, and a heating portion 132-3 arranged between each of the crucibles 132-1 and the cooling jacket 132-2. Furthermore, the deposition source 132 may include an angle limiting plate 132-4 for limiting an ejection angle of a deposition material ejected from each of the crucibles 132-1.

In this state, an ejection angle of a deposition material may signify an angle at which the deposition material from the nozzle of each of the crucibles 132-1 spreads. The angle limiting plate 132-4 may be arranged at opposite sides with respect to each of the crucibles 132-1 to face each other. Furthermore, the angle limiting plate 132-4 may include a plurality of angle limiting plates corresponding to the crucibles 132-1. At least a part of each of the angle limiting plates 132-4 may be bent.

The cooling jacket 132-2 may prevent an excessive increase of a temperature of the crucible 132-1 as a coolant, for example, cooling water, circulates outside the crucible 132-1. Furthermore, the heating portion 132-3 may include a heater to increase the temperature of the crucible 132-1 to change the phase of the deposition material in the crucible 132-1.

The deposition source driving portion 133 may drives the deposition source 132 to perform at least one of a linear motion and a rotation motion. In this state, the deposition source driving portion 133 may be in various forms. For example, the deposition source driving portion 133 may include a robot arm to make the deposition source 132 perform a linear motion and a rotation motion.

In another embodiment, the deposition source driving portion 133 may include a first deposition source driving portion 133-1 for linearly moving the deposition source 132 and a second deposition source driving portion 133-2 for rotating the deposition source 132. In this state, the first deposition source driving portion 133-1 may be provided on the second deposition source driving portion 133-2 to be connected to each other, or the second deposition source driving portion 133-2 may be provided on the first deposition source driving portion 133-1 to be connected to each other. In this case, the deposition source 132 may be provided on the first deposition source driving portion 133-1 or the second deposition source driving portion 133-2. In the following description, for convenience of explanation, a case in which the second deposition source driving portion 133-2 is provided on the first deposition source driving portion 133-1 and connected to the first deposition source driving portion 133-1, and the deposition source 132 is connected to the second deposition source driving portion 133-2 is mainly described in detail.

The mask assembly 134 may be provided in the deposition portion 130. In this state, the mask assembly 134 that is provided in a mask storing portion 150 that is separately provided may be supplied into the chamber 131. In this case, the mask storing portion 150 may be connected to the transfer portion 120 or the deposition portion 130. When the mask storing portion 150 is connected to the transfer portion 120, the robot arm 121 in the transfer portion 120 may supply the mask assembly 134 to the deposition portion 130. In another embodiment, when the mask storing portion 150 is connected to the deposition portion 130, the mask assembly 134 may be transferred from the mask storing portion 150 to the deposition portion 130 through a robot arm or shuttle provided in the mask storing portion 150 or the deposition portion 130.

The mask assembly 134 described above may include at least one opening portion through which the deposition material passes. In this state, a plurality of opening portions may be provided, and the opening portions may be arranged spaced apart from each other, forming a certain pattern. The mask assembly 134 may include a first mask assembly 134A provided corresponding to the first display substrate D1 and a second mask assembly 134B provided corresponding to the second display substrate D2. In this state, the first mask assembly 134A and the second mask assembly 134B may be arranged in the same chamber 131, and have the same opening portion pattern.

The substrate holder 135 may be provided in the chamber 131. In this state, the substrate holder 135 may fix or move linearly the first display substrate D1 or the second display substrate D2. In this case, although not illustrated, the substrate holder 135 may be connected to a linear motor.

The mask holder 136 may support the first mask assembly 134A or the second mask assembly 134B. In this state, the mask holder 136 may be provided in the chamber 131 to correspond to the first mask assembly 134A or the second mask assembly 134B.

The shutter portion 137 may be provided between the deposition source 132 and one of the first mask assembly 134A and the second mask assembly 134B. In an embodiment, the shutter portion 137 may be provided between the deposition source 132 and the first mask assembly 134A and between the second mask assembly 134B and the deposition source 132. In this state, the shutter portion 137 may be connected to the deposition source driving portion 133 and may move linearly with the deposition source 132 during a linear motion of the deposition source 132.

In another embodiment, the shutter portion 137 may be connected to at least one of the deposition source 132 and the deposition source driving portion 133. In this case, when the deposition source 132 performs a motion, the shutter portion 137 rotates and moves linearly with the deposition source 132 to be located between the deposition source 132 and one of the first mask assembly 134A and the second mask assembly 134B. In the following description, for convenience of explanation, a case in which the shutter portion 137 rotates and moves linearly with the deposition source 132 is mainly described in detail.

The shutter portion 137 described above may include a shutter 137-1 and a shutter driving portion 137-2. In this state, the shutter 137-1 may include a pair of shutters at opposite sides of the deposition source 132, and the shutter driving portion 137-2 may include a plurality of shutter driving portions connected to the shutters 137-1. The shutter 137-1 may control an amount of at least one deposition material supplied from the deposition source 132. In this state, one surface of the shutter 137-1 facing the deposition source 132 may be coated with a separate material or formed in a pattern to prevent the deposition material supplied from the deposition source 132 from being deposited thereon. The shutter driving portion 137-2 connected to the shutter 137-1 may move linearly the shutter 137-1. In this state, the shutter driving portion 137-2 may be formed in various forms. For example, the shutter driving portion 137-2 may include a linear motor. In another embodiment, the shutter driving portion 137-2 may include a pneumatic cylinder or a hydraulic cylinder.

In another embodiment, the shutter driving portion 137-2 may include a ball screw and a motor connected to the ball screw. In another embodiment, the shutter driving portion 137-2 may include a rack gear connected to the shutter 137-1, a spur gear connected to the rack gear, and a motor connected to the spur gear. In this state, the shutter driving portion 137-2 is not limited to the above descriptions, and the shutter driving portion 137-2 may include all structures and apparatuses that are connected to the shutter 137-1 and moves linearly the shutter 137-1.

The vision portion 138 may be provided in the chamber 131 and may take images of positions of one of the first display substrate D1 and the second display substrate D2 and the mask assembly 134. In this state, the vision portion 138 may take images of alignment marks provided on one of the first display substrate D1 and the second display substrate D2 and the mask assembly 134.

The pressure regulation portion 139 may be connected to the chamber 131 and may regulate the internal pressure of the chamber 131. In this state, the pressure regulation portion 139 may include a connecting pipe 139-1 connected to the chamber 131 and a pump 139-2 provided on the connecting pipe 139-1.

The connection portion 140 may be connected to and adjacent the transfer portion 120. In this state, the connection portion 140 may be provided with a separate transfer portion, for example, a robot arm or a shuttle, for transferring the first display substrate D1 and the second display substrate D2. Furthermore, the pressure of the connection portion 140 may be maintained identical or similar to the internal pressure of the transfer portion 120 when the first display substrate D1 or the second display substrate D2 is transferred from the transfer portion 120.

The unloading portion 160 may temporarily accommodate the first display substrate D1 or the second display substrate D2 that completed the deposition. Furthermore, the unloading portion 160 may carry out the first display substrate D1 or the second display substrate D2 that completed the deposition to the outside. In another embodiment, the unloading portion 160 is connected to a separate chamber in which a different material film or layer is formed on the first display substrate D1 or the second display substrate D2 that completed the deposition and may transfer the first display substrate D1 or the second display substrate D2 to the separate chamber. In this state, the unloading portion 160 may be provided with a robot arm or a shuttle to transfer the first display substrate D1 or the second display substrate D2. However, in the following description, for convenience of explanation, a case in which the unloading portion 160 temporarily stores and carries out the first display substrate D1 or the second display substrate D2 to the outside is mainly described in detail.

The sensor portion 170 may be provided on the deposition source 132 and measure at least one of the internal pressure and temperature of each of the crucibles 132-1 of the deposition source 132. For example, the sensor portion 170 may include a first sensor portion 171 for measuring the internal pressure of each of the crucibles 132-1 and a second sensor portion 172 for measuring the internal temperature of each of the crucibles 132-1.

An evaporation amount per unit hour of a deposition material that evaporates in each of the crucibles 132-1 may be expected based on the internal pressure of each of the crucibles 132-1 measured by the first sensor portion 171 and the internal temperature of each of the crucibles 132-1 measured by the second sensor portion 172, and the shutter portion 137 may be controlled based thereon. For example, the evaporation amount per unit hour of the deposition material that evaporates in each of the crucibles 132-1 may be expected based on Equation 1 below.

$$N = \frac{A \times \alpha \times (P^* - P)}{\sqrt{2\pi \times m \times k_B \times T}} \quad \text{[Equation 1]}$$

In Equation 1, "N" denotes an evaporation amount per unit hour of a deposition material (an evaporation rate of a deposition material). "A" denotes a surface area in which a deposition material evaporates. "$\alpha$" denotes an adsorption coefficient. "$P^*$" denotes a saturation vapor pressure of a deposition material at a temperature T. "P" denotes an internal pressure of the crucible 132-1 measured by the sensor portion 170. "m" denotes mass of a deposition material in the crucible 132-1. "$k_B$" denotes a Boltzmann's constant. "T" denotes the internal temperature of each of the crucibles 132-1 measured by the sensor portion 170. In this state, "$\alpha$", "$P^*$", "A", "m", and "$k_B$" may be in the form of a constant determined according to the deposition material.

In the above case, the evaporation rate of the deposition material may be calculated and then compared with a preset evaporation rate. In this state, when the calculated evaporation rate of the deposition material is greater than the preset evaporation rate, a degree of opening of the shutter portion 137 may be adjusted to be less than an existing opening degree.

In contrast, when the calculated evaporation rate of the deposition material is less than the preset evaporation rate, the degree of opening of the shutter portion 137 may be adjusted to be greater than the existing opening degree. In this case, the degree of opening of the shutter portion 137 may be adjusted such that the calculated evaporation rate of the deposition material and the preset evaporation rate become identical or similar to each other. In this state, the degree of opening of the shutter portion 137 may be adjusted through a distance between the shutters 137-1 arranged to face each other.

In a method of manufacturing a display apparatus (not shown) through the apparatus 100 for manufacturing a display apparatus as described above, when the first display substrate D1 or the second display substrate D2 is supplied to the loading portion 110, the first display substrate D1 or the second display substrate D2 may be moved from the loading portion 110 to the transfer portion 120. In this state, the first display substrate D1 and the second display substrate D2 may be sequentially transferred from the loading portion 110 to the transfer portion 120. Thereafter, the first display substrate D1 and the second display substrate D2 may be sequentially transferred to the deposition portion 130 via the transfer portion 120. In this state, after the first display substrate D1 is sequentially transferred to the loading portion 110, the transfer portion 120, and the deposition portion 130, the second display substrate D2 may be sequentially transferred to the loading portion 110, the transfer portion 120 and the deposition portion 130.

When the first display substrate D1 and the second display substrate D2 enter the chamber 131 as described above, the first display substrate D1 and the second display substrate D2 may be arranged to face each other in the chamber 131.

When the first display substrate D1 and the second display substrate D2 are arranged in the chamber 131 as described above, the mask assembly 134 is transferred from the mask storing portion 150 to the deposition portion 130 and may be located in the chamber 131. Although the first display substrate D1 and the mask assembly 134 are illustrated to be spaced apart from each other in the drawings, the first display substrate D1 and the mask assembly 134 may be in contact with each other and/or be as close as possible.

The positions of one of the first display substrate D1 and the second display substrate D2 and the mask assembly 134 may be photographed through the vision portion 138. In the following description, for convenience of explanation, a case in which the positions of the first display substrate D1 and the mask assembly 134 are first photographed through the vision portion 138 is mainly described in detail.

The vision portion 138 may take images of an alignment mark of the first display substrate D1 and an alignment mark of the mask assembly 134. After the positions of the first display substrate D1 and the mask assembly 134 are determined based on the positions of the alignment marks photographed by the vision portion 138, the position of at least one of the first display substrate D1 and the mask assembly 134 may be changed to be arranged at a preset position. In this state, at least one of the substrate holder 135 and the mask holder 136 may finely adjust the position of at least one of the first display substrate D1 and the mask assembly 134.

After the position of at least one of the first display substrate D1 and the mask assembly 134 is aligned, a deposition material may be deposited on the first display substrate D1 while the deposition source 132 moves linearly. In this state, while moving linearly from one side of the first display substrate D1 to the other side thereof, the deposition source 132 may supply the deposition material to the first display substrate D1. For example, while linearly moving from a lower side of the chamber 131 to an upper side thereof, the deposition source 132 may supply the deposition material. In this case, the deposition source 132 may simultaneously supply at least two deposition materials. In this state, different types of deposition materials may be accommodated in the crucibles 132-1. In particular, as the crucibles 132-1 are arranged in series in a linear motion direction of the deposition source 132, at least two deposition materials may be deposited on the first display substrate D1.

Furthermore, the deposition source 132 may perform the above-described linear motion multiple times. In this state, the deposition source 132 may move linearly from one side of the first display substrate D1 to the other side of the first display substrate D1, and then move linearly from the other side of the first display substrate D1 to the one side of the first display substrate D1. The deposition source 132 may move linearly multiple times between the one side of the first display substrate D1 and the other side of the first display substrate D1. In this state, the number of the linear motions of the deposition source 132 may be odd or even While the deposition material is deposed on the first display substrate D1 as described above, the second display substrate D2 and the mask assembly 134 may be aligned to each other. In this state, since the method of aligning the second display substrate D2 and the mask assembly 134 to each other is identical or similar to the above-described method of aligning the first display substrate D1 and the mask assembly 134 to each other, a detailed description thereof is omitted.

When the deposition of the deposition material on the first display substrate D1 is completed, the second deposition source driving portion 133-2 operates to change the direction of the nozzle of the crucible 132-1 to be directed at the second display substrate D2 from the first display substrate D1. Then, the deposition source 132 supplies the deposition material and may move linearly. Thus, the deposition material may be deposited on the second display substrate D2.

During the above process, the shutter portion 137 may control the amount of the deposition material ejected from the crucibles 132-1. For example, the shutter portion 137 may completely block the deposition material emitted from one of the crucibles 132-1. For example, the shutter portion 137 may prevent the first deposition material or the second deposition material from reaching the first display substrate D1 or the second display substrate D2 by completely closing one of a nozzle of the first crucible 132-1A or a nozzle of the second crucible 132-1B.

In another embodiment, the shutter portion 137 may control the amount of the deposition material by blocking a part of the deposition material emitted from at least one of the crucibles 132-1. For example, the shutter portion 137 may block a part of one of the nozzle of the first crucible 132-1A and the nozzle of the second crucible 132-1B. In other words, when the nozzle of the first crucible 132-1A is not blocked by the shutter portion 137, the amount of the deposition material supplied toward the first display substrate D1 or the second display substrate D2 through the nozzle of the first crucible 132-1A is assumed to be 100, e.g., 100%. When the shutter portion 137 blocks a part of the nozzle of the first crucible 132-1A, the amount of the deposition material supplied toward the first display substrate D1 or the second display substrate D2 through the nozzle of the first crucible 132-1A may be about 70, e.g., 70%. Accordingly, the shutter portion 137 may control the amount of the deposition material supplied from at least one of the crucibles 132-1.

In another embodiment, as illustrated in FIGS. 3A to 3C, the shutter portion 137 may operate according to the movement of the deposition source 132. For example, as illustrated in FIG. 3A, when the deposition source 132 moves from the one side of the first display substrate D1 to the other side thereof, the deposition material ejected from the first crucible 132-1A and the second crucible 132-1B may not be blocked. Furthermore, as illustrated in FIG. 3B, when the deposition source 132 moves from the other side of the first display substrate D1 to the one side thereof, the deposition material ejected from the first crucible 132-1A and the second crucible 132-1B may not be blocked. In contrast, as illustrated in FIG. 3C, when the deposition source 132 moves again from the one side of the first display substrate D1 to the other side thereof, the deposition material ejected from the first crucible 132-1A may not be blocked, whereas the deposition material ejected from the second crucible 132-1B may be blocked. The shutter portion 137 described above is not limited to the above description, and may employ all methods of controlling the amount of the deposition material ejected from at least a part of the crucibles 132-1.

In the shutter portion 137 described above, as the shutter 137-1 moves in a linear motion according to the operation of the shutter driving portion 137-2, that is, according to a degree of blocking an upper side of the nozzle of each of the crucibles 132-1, the amount of the deposition material supplied from each of the crucibles 132-1 to the first display substrate D1 or the second display substrate D2 may be controlled. In this state, a degree of the operation of the shutter 137-1 may vary according to a preset design value. In other words, the amount of the deposition material supplied to the first display substrate D1 or the second display substrate D2 may be in a preset state. Accordingly, a degree of the operation of the shutter 137-1 may be variable. In this state, the degree of the operation of the shutter 137-1 may be changed depending on the user's settings.

In addition to the above case, as described above, the operation of the shutter portion 137 may be controlled based on at least one of a pressure of each of the crucibles 132-1 measured by the first sensor portion 171 and a pressure of each of the crucibles 132-1 measured by the second sensor portion 172. For example, an evaporation rate of the deposition material of each of the crucibles 132-1 calculated based on the temperature and pressure measured from the crucible 132-1 may be compared with the preset evaporation rate. In this state, the preset evaporation rate may vary according to the thickness of the deposition material deposited on the first display substrate D1 and the second display substrate D2. A relationship between the evaporation rate and the thickness of the deposition material that is deposited may be stored in the form of a table. In this case, when the thickness of the deposition material deposited on the first display substrate D1 and the second display substrate D2 is set, an evaporation rate of the deposition material ejected from each of the crucibles 132-1 may be determined to be the preset evaporation rate.

In the above case, when the apparatus 100 for manufacturing a first display apparatus operates, a degree of opening of the shutter 137-1 may be in a determined state. Then, when the apparatus 100 for manufacturing a display apparatus operates, the degree of opening of the shutter 137-1 may be determined by comparing the above calculated evaporation rate of the deposition material with the preset evaporation rate. For example, when the above calculated evaporation rate of the deposition material is determined to be greater than the preset evaporation rate, the shutter 137-1 may be moved such that the degree of opening of the shutter 137-1 decreases to be less than the existing degree or the initial degree. In contrast, when the calculated evaporation rate of the deposition material is determined to be less than the preset evaporation rate, the shutter 137-1 may be moved such that the degree of opening of the shutter 137-1 increases to be greater than the existing degree or the initial degree. Furthermore, when the calculated evaporation rate of the deposition material is determined to be the same as the preset evaporation rate, the degree of opening of the shutter 137-1 may be maintained identical to the existing degree or the initial degree. The above process may be continuously performed when the apparatus 100 for manufacturing a display apparatus operates. In particular, as data measured by the first sensor portion 171 and the second sensor portion 172 is continuously fed back, the evaporation rate of the deposition material emitted by each of the crucibles 132-1 may be calculated. In particular, the above process may be performed when the shutter portion 137 opens only one of the crucibles 132-1.

When the deposition is completed as above, the first display substrate D1 and the second display substrate D2 may be transferred from the chamber 131 to the unloading portion 160 via the transfer portion 120. Then, the deposition material may be deposited on a new display substrate through the above process.

In the above case, the shutter portion 137 may form various forms of deposition material layers on the first display substrate D1 or the second display substrate D2. For example, the shutter portion 137 may block part of a deposition material or some of deposition materials. Furthermore, the shutter portion 137 may form the same layer in the same order on the first display substrate D1 and the second display substrate D2. For example, the number of deposition of the deposition material on the first display substrate D1 is even while the deposition source 132 moves from one of the one side and the other side of the first display substrate D1 to the other of the one side and the other side of the first display substrate D1. After depositing the deposition material on the first display substrate D1, the deposition source 132 is turned in a direction toward the second display substrate D2 and deposits the deposition material on the second display substrate D2. Then, the order of the deposition materials deposited on each of the first display substrate D1 and the second display substrate D2 may be different from each other.

To prevent the above, after the deposition source 132 is turned to face the second display substrate D2, the shutter portion 137 moves the deposition source 132 to the other of the one side and the other side of the second display substrate D2 in a state in which the supply of the deposition material from the deposition source 132 is prevented. Then, while the supply of the deposition material from the deposition source 132 is released, the deposition source 132 moves in a linear motion and the deposition material may be deposited on the second display substrate D2. In this case, the deposition material layer may be deposited on the first display substrate D1 and the second display substrate D2 in the same order.

Accordingly, according to the apparatus 100 for manufacturing a display apparatus and the method of manufacturing a display apparatus, as described above, a deposition material may be deposited on the first display substrate D1 or the second display substrate D2 in various orders. Furthermore, according to the apparatus 100 for manufacturing a display apparatus and the method of manufacturing a display apparatus, a deposition material having a various concentration may be deposited on the first display substrate D1 or the second display substrate D2.

According to the apparatus 100 for manufacturing a display apparatus and the method of manufacturing a display apparatus, a deposition material layer having an identical or similar value to the designed value may be deposited on the first display substrate D1 or the second display substrate D2. According to the apparatus 100 for manufacturing a display apparatus and the method of manufacturing a display apparatus, since a deposition material may be accurately deposited on the first display substrate D1 or the second display substrate D2, a high-resolution display apparatus may be manufactured.

Figure 4:
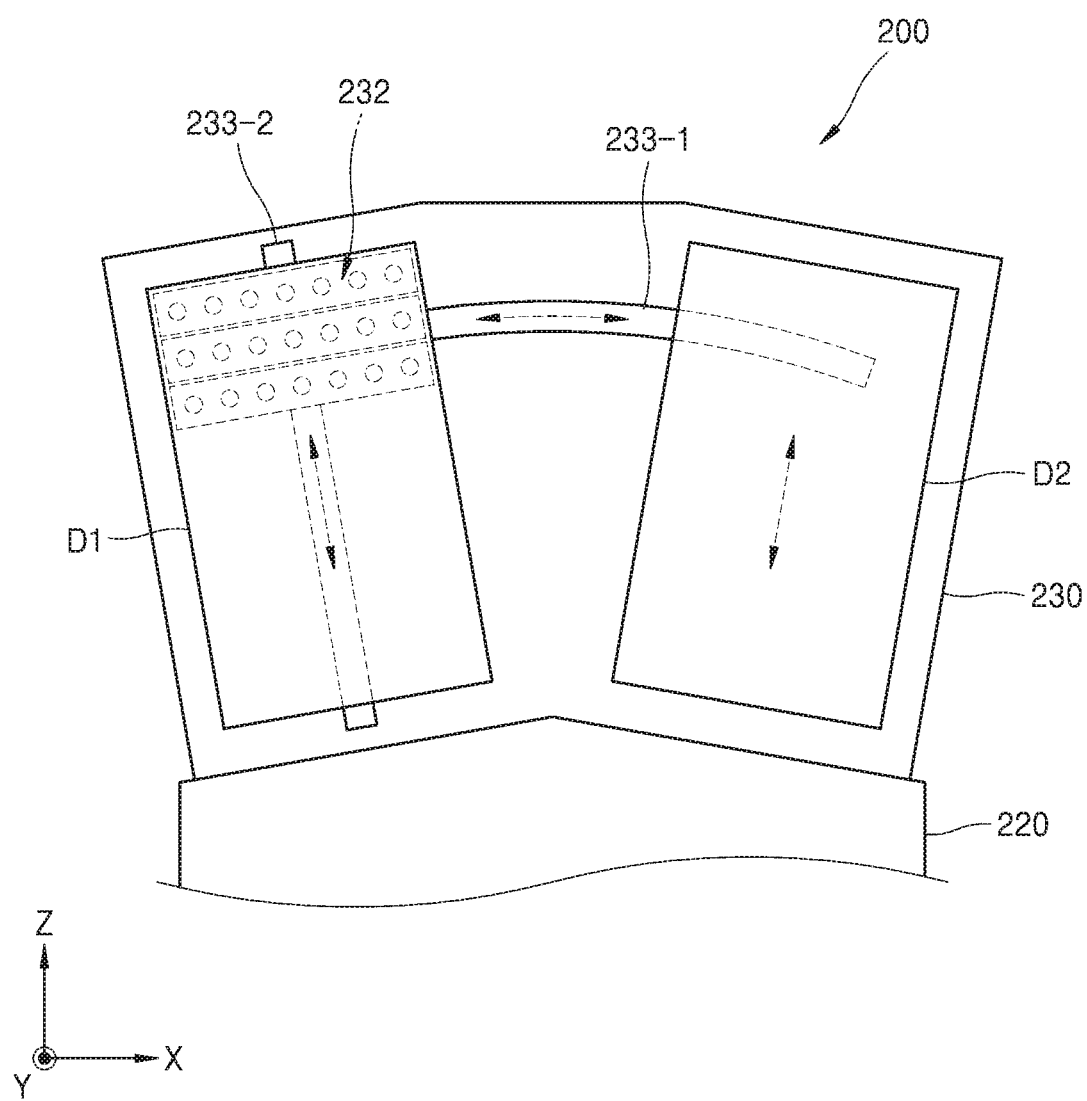
FIG. 4 is a plan view illustrating a part of an apparatus for manufacturing a display apparatus according to another embodiment.
Figure 5:
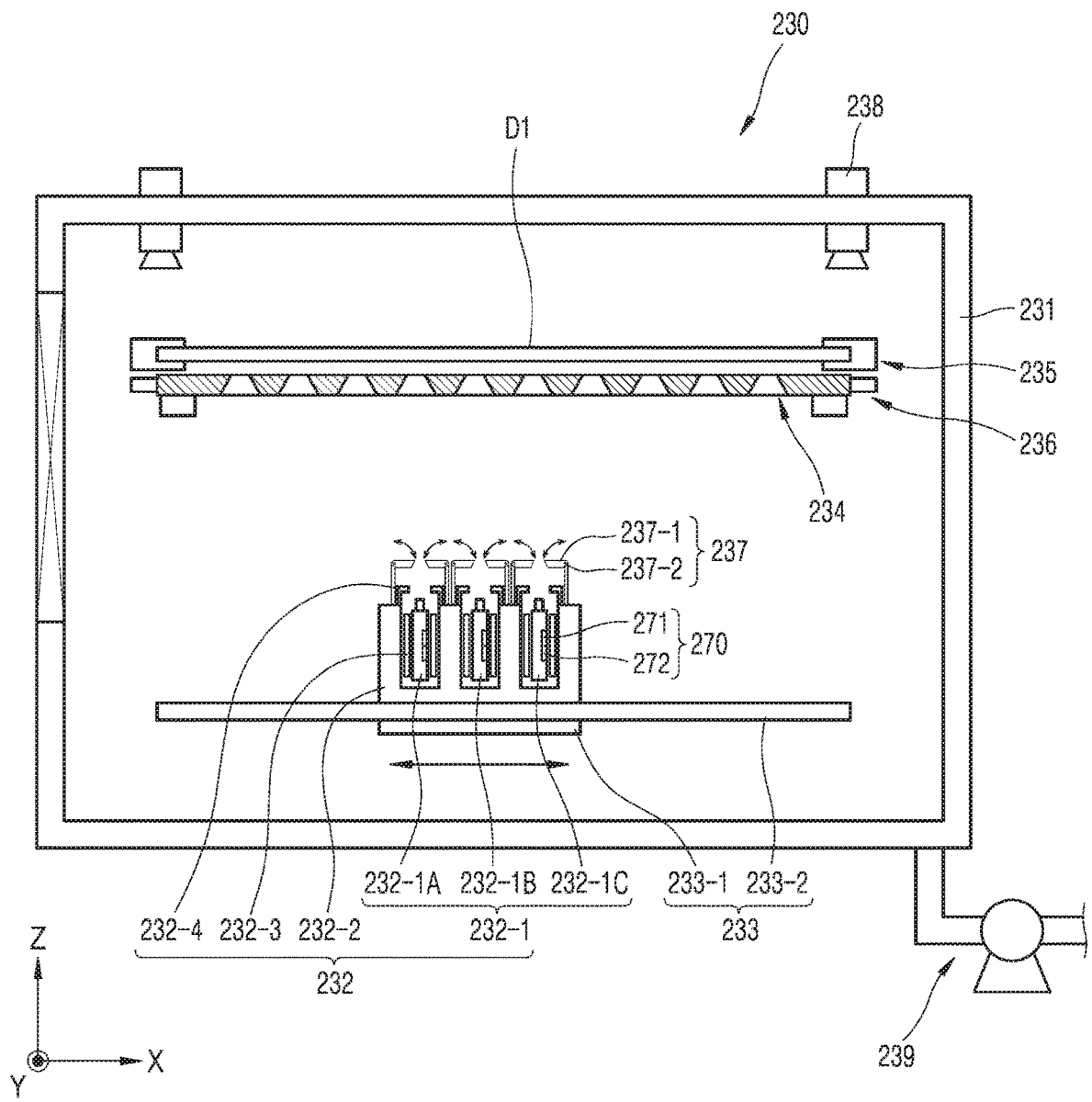
FIG. 5 is a cross-sectional view illustrating a part of the apparatus for manufacturing a display apparatus of FIG. 4.

FIG. 4 is a plan view illustrating a part of an apparatus 200 for manufacturing a display apparatus according to another embodiment. FIG. 5 is a cross-sectional view illustrating a part of the apparatus 200 for manufacturing a display apparatus of FIG. 4.

Referring to FIGS. 4 and 5, the apparatus 200 for manufacturing a display apparatus may include a loading portion (not shown), a transfer portion 220, a deposition portion 230, a connection portion (not shown), a mask storing portion (not shown), an unloading portion (not shown), and a sensor portion 270. In this state, since the loading portion, the transfer portion 220, the connection portion, the mask storing portion, the unloading portion, and the sensor portion 270 are identical or similar to those described in the above, detailed descriptions thereof are omitted.

The deposition portion 230 may include a chamber 231, a deposition source 232, a deposition source driving portion 233, a mask assembly 234, a substrate holder 235, a mask holder 236, a shutter portion 237, a vision portion 238, and a pressure regulation portion 239. In this state, the chamber 231, the mask assembly 234, the substrate holder 235, the mask holder 236, the vision portion 238, and the pressure regulation portion 239 may be identical or similar to those described in FIGS. 1 to 3C.

The deposition source 232 may include a plurality of crucibles 232-1, a cooling jacket 232-2, a heating portion 232-3, and an angle limiting plate 232-4. In this state, since the cooling jacket 232-2, the heating portion 232-3, and the angle limiting plate 232-4 are identical or similar to those described in FIG. 1, detailed descriptions thereof are omitted.

The crucibles 232-1 may include a first crucible 232-1A, a second crucible 232-2A, and a third crucible 232-1C. In this state, the same or different deposition materials may be accommodated in each of the first crucible 232-1A to the third crucible 232-1C. In the following description, for convenience of explanation, a case in which different deposition materials are accommodated in the first crucible 232-1A to the third crucible 232-1C is mainly described in detail.

The deposition source driving portion 233 may include a first deposition source driving portion 233-1 and a second deposition source driving portion 233-2. In this state, the first deposition source driving portion 233-1 may move the deposition source 232 from one of a lower surface of the first display substrate D1 or a lower surface of the second display substrate D2 to the other of the lower surface of the first display substrate D1 or the lower surface of the second display substrate D2. In this state, the first deposition source driving portion 233-1 may be provided in the form of a linear motor, a ball screw, or a motor. The second deposition source driving portion 233-2 is provided on the first deposition source driving portion 233-1 and may linearly move the deposition source 232 under the lower surface of one of the first display substrate D1 and the second display substrate D2. In this state, the second deposition source driving portion 233-2 may be formed to be identical or similar to the first deposition source driving portion 233-1 that is described above.

In an embodiment, the shutter portion 237 may be formed to be identical or similar to that described in FIGS. 1 to 3C. In another embodiment, the shutter portion 237, which performs a rotation motion, may control the amount of the deposition material supplied from each of the crucibles 232-1. In detail, the shutter portion 237 may include a rotation plate 237-1 that is pivotable and a rotation driving portion 237-2 connected to the rotation plate 237-1 and rotating the rotation plate 237-1. In this state, the rotation plate 237-1 may rotate between an X-axis and a Z-axis of FIG. 5 or may rotate around the Z-axis. In this case, the rotation driving portion 237-2 may include a decelerator and a motor connected to the decelerator. In this state, the shutter portion 237 may include a plurality of shutter portions corresponding to the number of the crucibles 232-1. The shutter portions 237 may be independently operated. The structure of the shutter portion 237 may be applied to the apparatus 200 for manufacturing a display apparatus illustrated in FIGS. 1 to 3. In the following description, for convenience of explanation, a case in which the shutter portion 237 includes the rotation plate 237-1 and the rotation driving portion 237-2 is mainly described in detail.

In a method of manufacturing a display apparatus (not shown) by using the above-described apparatus 200 for manufacturing a display apparatus, the first display substrate D1 and the second display substrate D2 may be input into the chamber 231. Furthermore, the mask assembly 234 may be input into the chamber 231. In this state, since the method of supplying the first display substrate D1, the second display substrate D2, and the mask assembly 234 to the chamber 231 is identical or similar to that described in FIGS. 1 to 3C, a detailed description thereof is omitted.

After one of the first display substrate D1 and the second display substrate D2 and the mask assembly 234 are aligned to each other, the deposition source 232 may perform deposition. In this state, since a method of aligning one of the first display substrate D1 and the second display substrate D2 and the mask assembly 234 is identical or similar to that described in FIGS. 1 to 3C, a detailed description thereof is omitted.

During the deposition as above, the shutter portion 237 may control the amount of the deposition material ejected from the first crucible 232-1A to the third crucible 232-1C. For example, the shutter portion 237 may block the deposition material ejected from at least one of the first crucible 232-1A to the third crucible 232-1C.

In another embodiment, the shutter portion 237 may block a part of the deposition material ejected from at least one of the first crucible 232-1A to the third crucible 232-1C. In this case, the rotation driving portion 237-2 may rotate the rotation plate 237-1. In this state, since the methods of controlling the amount of the deposition material ejected from the first crucible 232-1A to the third crucible 232-1C performed by the shutter portion 237 are the same, a case in which the shutter portion 237 controls the amount of the deposition material ejected from the first crucible 232-1A is mainly described in detail.

For example, when the rotation plate 237-1 is arranged parallel to the lower surface of the chamber 231, the shutter portion 237 may completely block the deposition material ejected from the first crucible 232-1A. When the rotation plate 237-1 and the lower surface of the chamber 231 form an acute angle, the shutter portion 237 may block a part of the deposition material ejected from the first crucible 232-1A.

In this state, a blocking amount of the deposition material ejected from the first crucible 232-1A may be determined according to an angle formed between the rotation plate 237-1 and the lower surface of the chamber 231. Furthermore, when the rotation plate 237-1 and the lower surface of the chamber 231 form a right angle, the shutter portion 237 may not block the deposition material ejected from the first crucible 232-1A. Accordingly, the shutter portion 237 may have only some of a plurality of deposition materials selectively deposited on the first display substrate D1 or the second display substrate D2, or may have the materials deposed on the first display substrate D1 or the second display substrate D2 by controlling the amount of at least one of the deposition materials.

The above-described operation of the shutter portion 237 may be controlled according to the value measured by a first sensor portion 271 and a second sensor portion 272. In detail, an evaporation rate of the deposition material ejected from each of the crucibles 232-1 may be calculated based on the pressure of each of the crucibles 232-1 measured by the first sensor portion 271 and the temperature of each of the crucibles 232-1 measured by the second sensor portion 272, and compared with the preset evaporation rate, thereby controlling the operation of the shutter portion 237.

When the deposition material is deposited on one of the first display substrate D1 and the second display substrate D2, the rotation angle of the rotation plate 237-1 may be determined at an initial stage. In this state, the amount of the deposition material that reaches one of the first display substrate D1 and the second display substrate D2 from each of the crucibles 232-1 may be determined according to the rotation angle of the rotation plate 237-1 that is a degree of rotation of the rotation plate 237-1 in a state in which the rotation plate 237-1 completely blocks each of the crucibles 232-1. Furthermore, a thickness of the deposition material deposited on one of the first display substrate D1 and the second display substrate D2 through the above process may be determined. In this case, when the deposition of the deposition material starts, the rotation angle of the rotation plate 237-1 may be controlled to be identical to the preset rotation angle.

In this state, by comparing the calculated evaporation rate of the deposition material with the preset evaporation rate of the deposition material, when the calculated evaporation rate of the deposition material is greater than the preset evaporation rate of the deposition material, the rotation plate 237-1 may be rotated such that the rotation angle of the rotation plate 237-1 is less than the preset rotation angle. In contrast, when the calculated evaporation rate of the deposition material is less than the preset evaporation rate of the deposition material, the rotation plate 237-1 may be rotated such that the rotation angle of the rotation plate 237-1 is greater than the preset rotation angle. When the calculated evaporation rate of the deposition material is the same as the preset evaporation rate of the deposition material, the rotation plate 237-1 may be stopped to maintain the current state.

In the above case, the thickness of the deposition material deposited on one of the first display substrate D1 and the second display substrate D2, the rotation angle of the rotation plate 237-1, and the relation between the evaporation rates may be programmed in the form of an equation or stored in the form of a table. In this state, the above control may be individually and independently performed by the shutter portion 237 provided in each of the crucibles 232-1.

In the above case, while the deposition material is deposited on one of the first display substrate D1 and the second display substrate D2, the other of the first display substrate D1 or the second display substrate D2 may be aligned with the mask assembly 234.

After the deposition of the deposition material on one of the first display substrate D1 and the second display substrate D2 through the deposition source 232 is completed, the deposition source 232 may be moved toward the other of the first display substrate D1 and the second display substrate D2. The deposition source 232 may be moved by the first deposition source driving portion 233-1, and the second deposition source driving portion 233-2 may be moved with the deposition source 232 by the first deposition source driving portion 233-1.

When the deposition source 232 is moved as above, the deposition source 232 may be moved and disposed from a lower surface of one of the first display substrate D1 and the second display substrate D2 to a lower surface of the other of the first display substrate D1 and the second display substrate D2. Then, while the second deposition source driving portion 233-2 linearly moves the deposition source 232, the deposition material may be deposited on the other of the first display substrate D1 and the second display substrate D2.

When the deposition of the deposition material on the first display substrate D1 and the second display substrate D2 is completed as described above, the first display substrate D1 and the second display substrate D2 may be carried out to the outside through an unloading portion.

Accordingly, according to the apparatus 200 for manufacturing a display apparatus and a method of manufacturing a display apparatus, the deposition material may be deposited on the first display substrate D1 or the second display substrate D2 in various orders. Furthermore, according to the apparatus 200 for manufacturing a display apparatus and the method of manufacturing a display apparatus, a deposition material having a various concentration may be deposited on the first display substrate D1 or the second display substrate D2.

According to the apparatus 200 for manufacturing a display apparatus and the method of manufacturing a display apparatus, a deposition material layer having a form identical or similar to the designed value may be deposited on the first display substrate D1 or the second display substrate D2. In the apparatus 200 for manufacturing a display apparatus and the method of manufacturing a display apparatus, since the deposition material may be precisely deposited on the first display substrate D1 or the second display substrate D2, a high-resolution display apparatus may be manufactured.

Figure 6:
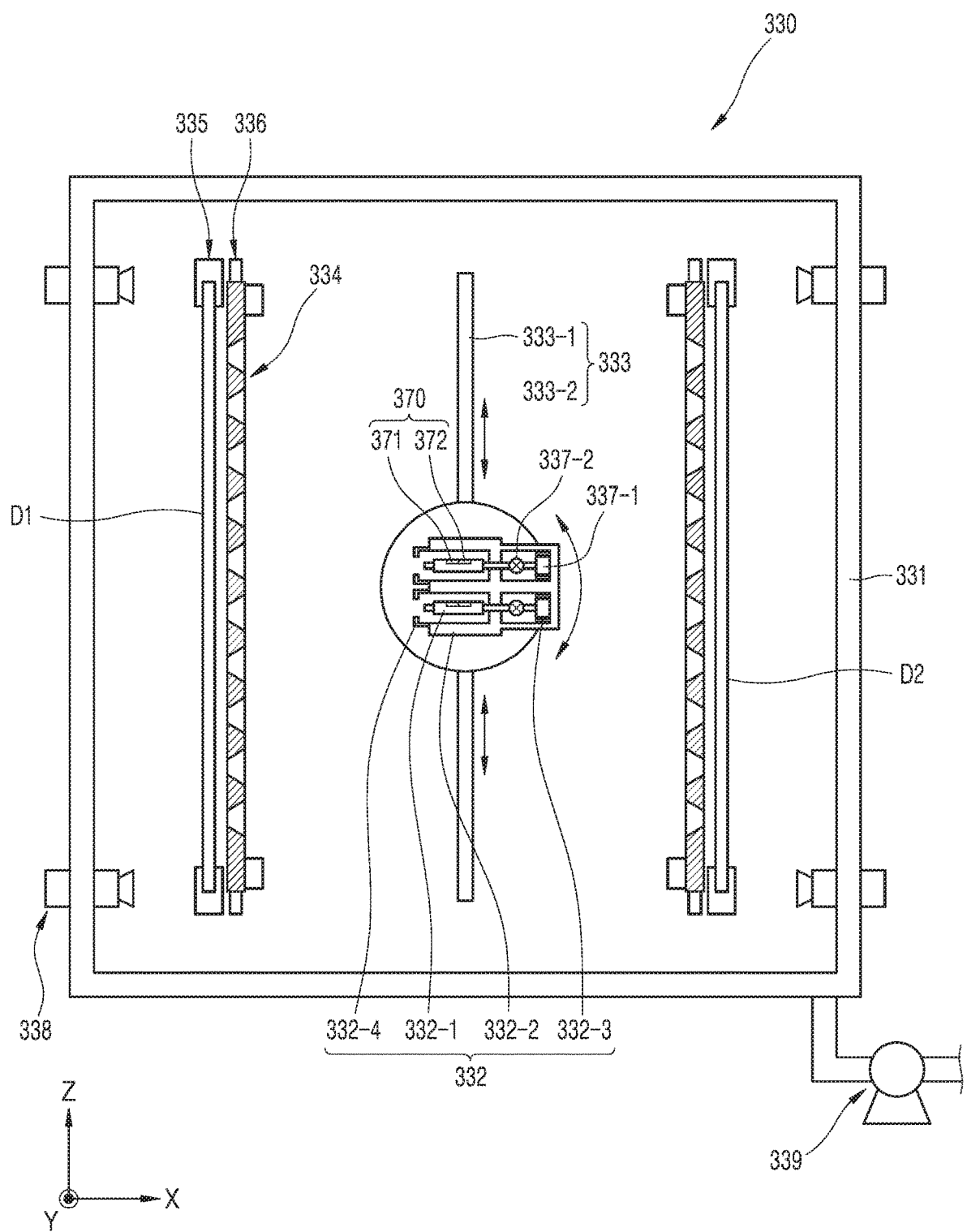
FIG. 6 is a cross-sectional view illustrating a part of an apparatus for manufacturing a display apparatus according to another embodiment.

FIG. 6 is a cross-sectional view illustrating a part of an apparatus for manufacturing a display apparatus according to another embodiment.

Referring to FIG. 6, an apparatus (not shown) for manufacturing a display apparatus may include a loading portion (not shown), a transfer portion (not shown), a deposition portion 330, a connection portion (not shown), a mask storing portion (not shown), an unloading portion (not shown), and a sensor portion 370. In this state, since the loading portion, the transfer portion, the connection portion, the mask storing portion, the unloading portion, and the sensor portion 370 are identical or similar to those described in FIGS. 1 to 3C, detailed descriptions thereof are omitted.

The deposition portion 330 may include a chamber 331, a deposition source 332, a deposition source driving portion 333, a mask assembly 334, a substrate holder 335, a mask holder 336, a deposition material supply portion 337-1, a cut-off portion 337-2, a vision portion 338, and a pressure regulation portion 339. In this state, the chamber 331, the deposition source driving portion 333, the mask assembly 334, the substrate holder 335, the mask holder 336, the vision portion 338 and the pressure regulation portion 339 may be identical or similar to those described in FIGS. 1 to 3C.

The deposition source 332 may include a plurality of crucibles 332-1, a cooling jacket 332-2, a heating portion 332-3, and an angle limiting plate 332-4. At least two deposition materials may be accommodated in the crucibles 332-1. In this state, different deposition materials may be accommodated in the respective crucibles 332-1. In particular, a deposition material in a gaseous state may be stored in each of the crucibles 332-1.

The cooling jacket 332-2 may be arranged encompassing each of the crucibles 332-1, the deposition material supply portion 337-1, and the cut-off portion 337-2. In this state, the cooling jacket 332-2 may control the temperature of at least one of each of the crucibles 332-1, the deposition material supply portion 337-1, and the cut-off portion 337-2, by circulating a coolant as described above in FIGS. 1 to 3C.

The heating portion 332-3 is provided in the cooling jacket 332-2 to change the form of the deposition material in the deposition material supply portion 337-1. For example, the heating portion 332-3, which includes a heater, may change the deposition material in the deposition material supply portion 337-1 from a solid state to a gaseous state or from a solid state to a liquid state and then to a gaseous state. Since the angle limiting plate 332-4 is identical or similar to that described in FIGS. 1 to 3C, a detailed description thereof is omitted.

The deposition material may be accommodated in the deposition material supply portion 337-1, and a state of the deposition material may be changed. In this state, the deposition material supply portion 337-1 may include a plurality of deposition material supply portions to be connected to the respective crucibles 332-1.

The cut-off portion 337-2 is arranged on a flow path connecting each deposition material supply portion 337-1 and each crucible 332-1, and may control the amount of the deposition material supplied from each deposition material supply portion 337-1 to each crucible 332-1. In this state, the cut-off portion 337-2 may include a solenoid valve and control a degree of opening of each flow path.

When the method of manufacturing a display apparatus (not shown) is described through the apparatus for manufacturing a display apparatus, the first display substrate D1 and the second display substrate D2 may be arranged in the chamber 331. In this state, the first display substrate D1 and the second display substrate D2 may be vertically arranged with respect to the lower surface of the chamber 331. Furthermore, one of the first display substrate D1 and the second display substrate D2 may be positionally aligned with the mask assembly 334.

Then, while the deposition source 332, the deposition material supply portion 337-1, and the cut-off portion 337-2 are linearly moved by a first deposition source driving portion 333-1, the deposition material may be deposited on one of the first display substrate D1 and the second display substrate D2. In this state, the cut-off portion 337-2 may control the amount of the deposition material supplied from the deposition material supply portion 337-1 to each of the crucibles 332-1. In particular, the cut-off portion 337-2 may be controlled based on a design value that is previously set by a user.

While the deposition material is deposited as described above, the other of the first display substrate D1 and the second display substrate D2 may be positionally aligned with the mask assembly 334.

When the deposition of the deposition material on one of the first display substrate D1 and the second display substrate D2 is completed, the direction of the deposition source 332 may be changed by a second deposition source driving portion 333-2 from one of the first display substrate D1 and the second display substrate D2 to the other of the first display substrate D1 and the second display substrate D2. In this state, since the method of changing the direction of the deposition source 332 is identical or similar to that described in FIG. 1, a detailed description thereof is omitted. When the direction of the deposition source 332 is changed as described above, the directions of the deposition material supply portion 337-1 and the cut-off portion 337-2 may be changed with the deposition source 332.

After the direction of the deposition source 332 is changed as described above, while the second deposition source driving portion 333-2 is operated to linearly move the deposition source 332, the deposition material supply portion 337-1, and the cut-off portion 337-2, the deposition material may be deposited on the other of the first display substrate D1 and the second display substrate D2. In this state, the cut-off portion 337-2 may control the amount of the deposition material ejected from each of the crucibles 332-1 based on the preset value.

The cut-off portion 337-2 may perform the control based on a value measured by at least one of a first sensor portion 371 and a second sensor portion 372 arranged in each of the crucibles 332-1. In this state, the first sensor portion 371 and the second sensor portion 372 may be arranged in each of the crucibles 332-1 or arranged on the flow path that connects each of the crucibles 332-1 and each deposition material supply portion 337-1. In the following description, for convenience of explanation, a case in which the first sensor portion 371 and the second sensor portion 372 are arranged in each of the crucibles 332-1 is mainly described in detail.

An evaporation rate of the deposition material ejected from each of the crucibles 332-1 may be calculated based on the internal pressure of each of the crucibles 332-1 measured by the first sensor portion 371 and the internal temperature of each of the crucibles 332-1 measured by the second sensor portion 372. In this state, the evaporation rate of the deposition material ejected from each of the crucibles 332-1 may be calculated by the above-described Equation 1. In this case, in Equation 1, "A" may denote an area where the deposition material in the deposition material supply portion 337-1 is exposed to the inside of the deposition material supply portion 337-1.

The amount of the deposition material supplied to each of the crucibles 332-1 through the cut-off portion 337-2 may be controlled by comparing the above calculated evaporation rate of the deposition material ejected from each of the crucibles 332-1 with the preset evaporation rate. For example, when the evaporation rate of the deposition material ejected from each of the crucibles 332-1 is greater than the preset evaporation rate, the cut-off portion 337-2 may control such that the amount of the deposition material supplied from each deposition material supply portion 337-1 to each of the crucibles 332-1 decreases to be less than an existing or initial amount.

In contrast, when the evaporation rate of the deposition material ejected from each of the crucibles 332-1 is less than the preset evaporation rate, the cut-off portion 337-2 may be controlled such that the amount of the deposition material supplied from each deposition material supply portion 337-1 to each of the crucibles 332-1 increases to be greater than the existing or initial amount.

Furthermore, when the evaporation rate of the deposition material ejected from each of the crucibles 332-1 is identical to the preset evaporation rate, the cut-off portion 337-2 may maintain an existing or initial state. Such a work may be continuously performed while the deposition material is deposited on one of the first display substrate D1 and the second display substrate D2.

When the deposition of the deposition material on the first display substrate D1 and the second display substrate D2 is completed, the first display substrate D1 and the second display substrate D2 may be moved from the chamber 331 to an unloading portion.

Accordingly, in the apparatus for manufacturing a display apparatus and the method of manufacturing a display apparatus, the deposition material may be deposited on the first display substrate D1 or the second display substrate D2 in various orders. Furthermore, according to the apparatus for manufacturing a display apparatus and method of manufacturing a display apparatus, a deposition material having a various concentration may be deposited on the first display substrate D1 or the second display substrate D2.

According to the apparatus for manufacturing a display apparatus and the method of manufacturing a display apparatus, a deposition material layer having a form identical or similar to the designed value may be deposited on the first display substrate D1 or the second display substrate D2. In the apparatus for manufacturing a display apparatus and the method of manufacturing a display apparatus, since the deposition material may be precisely deposited on the first display substrate D1 or the second display substrate D2, a high-resolution display apparatus may be manufactured.

Figure 7:
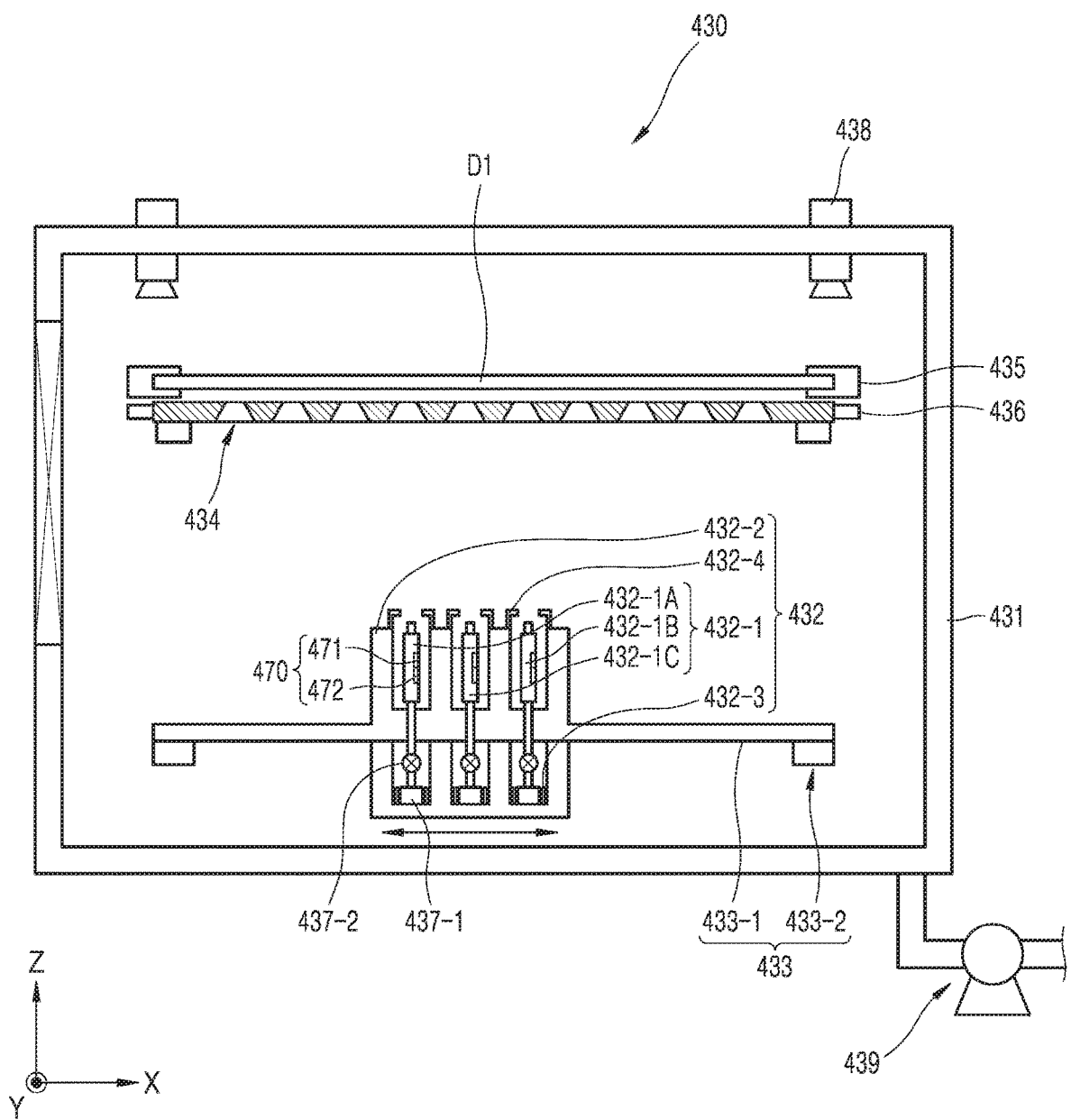
FIG. 7 is a cross-sectional view illustrating a part of an apparatus for manufacturing a display apparatus according to another embodiment.

FIG. 7 is a cross-sectional view illustrating a part of an apparatus for manufacturing a display apparatus according to another embodiment.

Referring to FIG. 7, the apparatus (not shown) for manufacturing a display apparatus may include a loading portion (not shown), a transfer portion (not shown), a deposition portion 430, a connection portion (not shown), a mask storing portion (not shown), an unloading portion (not shown), and a sensor portion 470. In this state, since the loading portion, the transfer portion, the connection portion, the mask storing portion, the unloading portion, and the sensor portion 470 are identical or similar to those described in FIGS. 1 to 3C, detailed descriptions thereof are omitted.

The deposition portion 430 may include a chamber 431, a deposition source 432, a deposition source driving portion 433, a mask assembly 434, a substrate holder 435, a mask holder 436, a deposition material supply portion 437-1, a cut-off portion 437-2, a vision portion 438, and a pressure regulation portion 439. In this state, the chamber 431, the mask assembly 434, the substrate holder 435, the mask holder 436, the vision portion 438, and the pressure regulation portion 439 may be identical or similar to those described in FIGS. 1 to 3C. Furthermore, since the deposition source 432, the deposition material supply portion 437-1, and the cut-off portion 437-2 are identical or similar to those described in FIG. 6, detailed descriptions thereof are omitted.

In this state, the deposition source 432 may include a plurality of crucibles 432-1, a cooling jacket 432-2, a heating portion 432-3, and an angle limiting plate 432-4, and the crucibles 432-1 may include a first crucible 432-1A, a second crucible 432-1B, and a third crucible 432-1C. Since the deposition source driving portion 433 is identical or similar to that described in FIGS. 4 and 5, a detailed description thereof is omitted.

When a display apparatus (not shown) is manufactured by using the apparatus for manufacturing a display apparatus, the first display substrate D1 and a second display substrate D2 (not shown) may be arranged in the chamber 431 of the deposition portion 430, and the deposition material may be deposited thereon. In this state, the first display substrate D1 and the second display substrate D2 may be arranged as illustrated in FIG. 4.

In detail, one of the first display substrate D1 and the second display substrate D2 may be positionally aligned with the mask assembly 434. Then, while a second deposition source driving portion 433-2 linearly moves the deposition source 432, the deposition material supply portion 437-1, and the cut-off portion 437-2, the deposition material may be deposited on one of the first display substrate D1 and the second display substrate. In this state, the cut-off portion 437-2 may control the amount of the deposition material supplied from the deposition material supply portion 437-1 to each of the crucibles 432-1. In particular, the cut-off portion 437-2 may be controlled based on a design value preset by a user. While the deposition material is deposited as described above, the other of the first display substrate D1 and the second display substrate D2 may be positionally aligned with the mask assembly 434.

When the deposition of the deposition material on one of the first display substrate D1 and the second display substrate D2 is completed, a first deposition source driving portion 433-1 may move the deposition source 432 from a lower surface of one of the first display substrate D1 and the second display substrate D2 to a lower surface of the other of the first display substrate D1 and the second display substrate D2. In this state, since the method of moving the deposition source 432 is identical or similar to that described in FIGS. 4 and 5, a detailed description thereof is omitted.

Then, while the second deposition source driving portion 433-2 is operated to linearly move the deposition source 432, the deposition material supply portion 437-1, and the cut-off portion 437-2, the deposition material may be deposited on the other of the first display substrate D1 and the second display substrate D2. In this state, the cut-off portion 437-2 may control the amount of the deposition material ejected from each of the crucibles 432-1 based on the preset value.

In the above case, since the cut-off portion 437-2 controls the amount of the deposition material supplied from each of the crucibles 432-1 to one of the first display substrate D1 and the second display substrate, based on the values measured by a first sensor portion 471 and a second sensor portion 472, the thickness of the deposition material layer deposited on one of the first display substrate D1 and the second display substrate D2 may be controlled.

In detail, the cut-off portion 437-2 may measure an evaporation amount of the deposition material ejected from each of the crucibles 432-1 based on the internal pressure of each of the crucibles 432-1 measured by the first sensor portion 471 and the internal temperature of each of the crucibles 432-1 measured by the second sensor portion 472. In this state, the amount of the deposition material supplied from the deposition material supply portion 437-1 to each of the crucibles 432-1 may be controlled through the cut-off portion 437-2, by comparing the evaporation amount of the deposition material ejected from each of the crucibles 432-1 and the preset evaporation amount. In this state, since the method of controlling the cut-off portion 437-2 is identical or similar to that described in FIG. 6, a detailed description thereof is omitted. Particular, in this case, the thickness of the deposition material deposited on one of the first display substrate D1 and the second display substrate D2 may be maintained the same as the preset thickness, by controlling the evaporation amount of the deposition material ejected from each of the crucibles 432-1.

When the deposition of the deposition material on the first display substrate D1 and the second display substrate D2 is completed, the first display substrate D1 and the second display substrate D2 may be moved from the chamber 431 toward an unloading portion.

Accordingly, in the apparatus for manufacturing a display apparatus and the method of manufacturing a display apparatus, the deposition material may be deposited on the first display substrate D1 or the second display substrate D2 in various orders. Furthermore, according to the apparatus for manufacturing a display apparatus and method of manufacturing a display apparatus, a deposition material having a various concentration may be deposited on the first display substrate D1 or the second display substrate D2.

According to the apparatus for manufacturing a display apparatus and the method of manufacturing a display apparatus, a deposition material layer having a form identical or similar to the designed value may be deposited on the first display substrate D1 or the second display substrate D2. In the apparatus 200 for manufacturing a display apparatus and the method of manufacturing a display apparatus, since the deposition material may be precisely deposited on the first display substrate D1 or the second display substrate D2, a high-resolution display apparatus may be manufactured.

Figure 8:
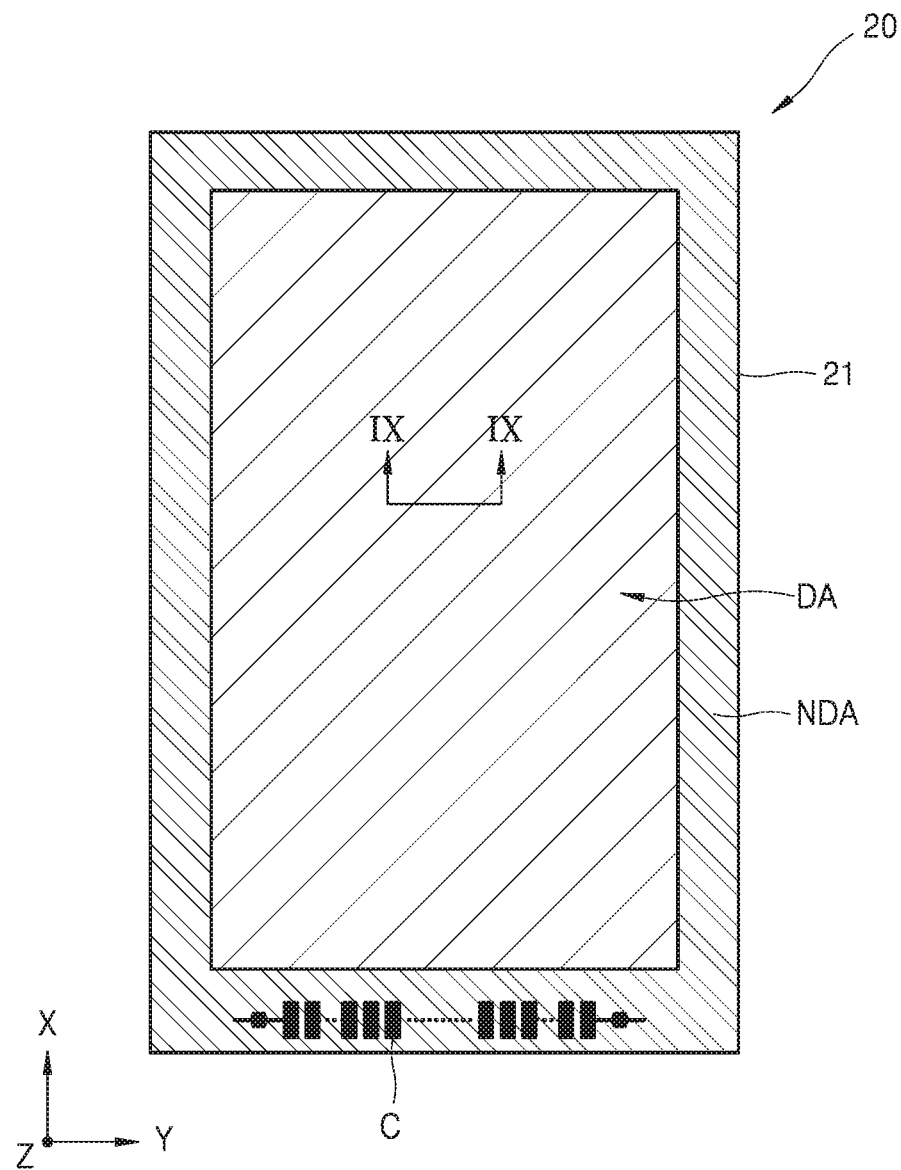
FIG. 8 is a plan view of a display apparatus manufactured by the apparatus for manufacturing a display apparatus illustrated in one of FIGS. 1, 4, 6, and 7.
Figure 9:
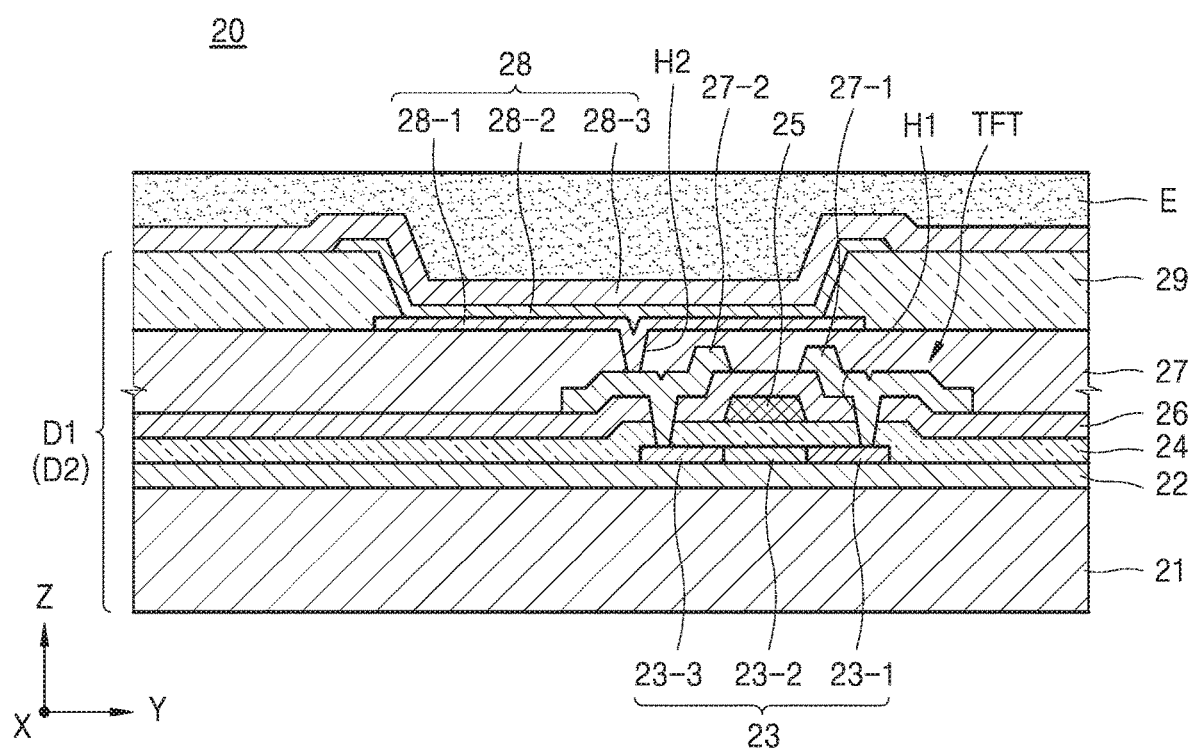
FIG. 9 is a cross-sectional view taken along line IX-IX of FIG. 8.

FIG. 8 is a plan view of a display apparatus 20 manufactured by the apparatus for manufacturing a display apparatus illustrated in one of FIGS. 1, 4, 6, and 7. FIG. 9 is a cross-sectional view taken along line IX-IX of FIG. 8.

Referring to FIGS. 8 and 9, in the display apparatus 20, a display area DA and a non-display area NDA outside the display area DA may be defined on a substrate 21. An emission unit may be arranged in the display area DA, and a power wiring (not shown) may be arranged in the non-display area NDA. Furthermore, a pad portion C may be arranged in the non-display area NDA.

In this state, the display apparatus 20 may include the first display substrate D1 or a second display substrate (not shown). In this case, since the first display substrate D1 or the second display substrate is identical or similar to each other, in the following description, for convenience of explanation, a case in which the display apparatus 20 includes the first display substrate D1 is mainly described in detail.

The display apparatus 20 may include the first display substrate D1, an intermediate layer 28-2, a pixel electrode 28-1, and an encapsulation portion (not shown). In this state, the first display substrate D1 may include the substrate 21, a buffer layer 22, an active layer 23, a gate insulating layer 24, a gate electrode 25, an interlayer insulating layer 26, a source electrode 27-1, a drain electrode 27-2, a passivation layer 27, the pixel electrode 28-1, and a pixel defining layer 29.

The substrate 21 may be formed of a plastic material, or a metal material such as stainless steel (SUS) or Ti. Furthermore, the substrate 21 may be formed of polyimide (PI). In the following description, for convenience of explanation, a case in which the substrate 21 is formed of polyimide is mainly described in detail.

A thin film transistor TFT may be formed on the substrate 21, and the passivation layer 27 may be formed to cover the thin film transistor TFT, and an organic light-emitting diode (OLED) 28 may be formed on the passivation layer 27.

The buffer layer 22, which is formed of an organic compound and/or an inorganic compound, may be further formed on an upper surface of the substrate 21. The buffer layer 22 may be formed of SiOx (x≥1) or SiNx (x≥1).

After the active layer 23 arranged in a certain pattern on the buffer layer 22 is formed, the active layer 23 is buried by the gate insulating layer 24. The active layer 23 may further include a source region 23-1 and a drain region 23-3, and a channel region 23-2 therebetween.

The active layer 23 may be formed to contain various materials. For example, the active layer 23 may contain an inorganic semiconductor material such as amorphous silicon or crystalline silicon. In another example, the active layer 23 may contain oxide semiconductor. In another example, the active layer 23 may contain an organic semiconductor material. However, in the following description, for convenience of explanation, a case in which the active layer 23 is formed of amorphous silicon is mainly described in detail.

The active layer 23 may be formed by forming an amorphous silicon film on the buffer layer 22 and then crystallizing the amorphous silicon film into a polycrystalline silicon film, and patterning the polycrystalline silicon film. In the active layer 23, the source region 23-1 and the drain region 23-3 are doped with impurities according to the type of thin film transistor TFT, for example, a drive TFT (not shown) or a switching TFT (not shown).

The gate electrode 25 corresponding to the active layer 23 and the interlayer insulating layer 26 that buries the gate electrode 25 are formed on an upper surface of the gate insulating layer 24.

After a contact hole H1 is formed in the interlayer insulating layer 26 and the gate insulating layer 24, the source electrode 27-1 and the drain electrode 27-2 are formed on the interlayer insulating layer 26 to respectively contact the source region 23-1 and the drain region 23-3.

The passivation layer 27 is formed on the thin film transistor TFT, and a pixel electrode 28-1 of the OLED 28 is formed on the passivation layer 27. The pixel electrode 28-1 contacts the drain electrode 27-2 of the thin film transistor TFT by a via hole H2 formed in the passivation layer 27. The passivation layer 27 may be formed of an inorganic material and/or an organic material in a single layer or in two or more layers. While the passivation layer 27 may be formed as a planarization film such that an upper surface thereof is flat regardless of unevenness of a lower film, the upper surface may be formed to be uneven along the unevenness of the film located below the passivation layer 27. The passivation layer 27 may be formed of a transparent insulating material to achieve a resonance effect.

After the pixel electrode 28-1 is formed on the passivation layer 27, the pixel defining layer 29 is formed of an organic material and/or inorganic material to cover the pixel electrode 28-1 and the passivation layer 27, and is opened to expose and extend to the pixel electrode 28-1.

The intermediate layer 28-2 and a counter electrode 28-3 are formed at least on the pixel electrode 28-1. In another embodiment, the counter electrode 28-3 may be formed on an entire surface of a display substrate D1 or D2. In this case, the counter electrode 28-3 may be formed on the intermediate layer 28-2 and the pixel defining layer 29. In the following description, for convenience of explanation, a case in which the counter electrode 28-3 is formed on the intermediate layer 28-2 and the pixel defining layer 29 is mainly described in detail.

The pixel electrode 28-1 functions as an anode, and the counter electrode 28-3 functions as a cathode. The polarities of the pixel electrode 28-1 and the counter electrode 28-3 may be reversed.

The pixel electrode 28-1 and the counter electrode 28-3 are insulated from each other by the intermediate layer 28-2, and apply voltages of different polarities to the intermediate layer 28-2. Accordingly, light is emitted from an organic emission layer.

The intermediate layer 28-2 may include an organic emission layer. In another selective example, the intermediate layer 28-2 may include an organic emission layer, and may further include at least one of a hole injection layer (HIL), a hole transport layer (HTL), an electron transport layer (ETL), and an electron injection layer (EIL). In another embodiment, in addition to the organic emission layer, the HIL, the HTL, the ETL, and the EIL, the intermediate layer 28-2 may include an intermediate buffer layer (interlayer) arranged between at least two adjacent layers of the organic emission layer, the HIL, the HTL, the ETL, and the EIL. The present disclosure is not limited thereto, and the intermediate layer 28-2 may include an organic emission layer, and may further include various other functional layers (not shown).

Each layer forming the above-described intermediate layer may be manufactured by an apparatus (not shown) for manufacturing the display apparatus illustrated in FIG. 1, 4, 6, or 7. In an embodiment, as the deposition materials supplied from the respective crucibles of the apparatus for manufacturing the display apparatus illustrated in FIG. 1, 4, 6, or 7 are sequentially deposited, the respective layers of the intermediate layer 28-2 may be formed.

In other words, one layer forming the intermediate layer 28-2 may be in the form in which the deposition materials supplied from a plurality of crucibles are sequentially deposited or in the form in which at least two deposition materials supplied from a plurality of crucibles are mixed. In another embodiment, the intermediate layer 28-2 may be formed as the deposition materials supplied from the respective crucibles are sequentially deposited. In this case, a deposition material supplied form one crucible may form one layer forming the intermediate layer 28-2. Furthermore, as the deposition materials ejected from adjacent crucibles are mixed with each other, deposition materials of different types may form one layer forming the intermediate layer 28-2.

In the above case, the deposition sequence of the respective layers or a mixture ratio of materials included in each layer may be determined by controlling the shutter portion or the cut-off portion as described above.

The intermediate layer 28-2 may include a plurality of intermediate layers, and the intermediate layers 28-2 may be formed in the display area DA. In particular, the intermediate layers 28-2 may be formed in the display area DA having a shape except a rectangle or a square. In this state, the intermediate layers 28-2 may be arranged spaced apart from each other in the display area DA.

One unit pixel may include a plurality of sub-pixels, and the sub-pixels may emit light of various colors. For example, a plurality of sub-pixels may include sub-pixels emitting light of red, green, and blue colors, and may include sub-pixels (not shown) emitting light of red, green, blue, and white colors.

The encapsulation portion is arranged to face the substrate 21, and may include an encapsulation substrate (not shown) that shields the first display substrate D1, the intermediate layer 28-2, and the counter electrode 28-3. In this state, the encapsulation substrate may be identical or similar to the substrate 21. Furthermore, a sealing portion (not shown) may be arranged between the encapsulation substrate and the substrate 21 to completely shield the intermediate layer 28-2 and the counter electrode 28-3 from the outside. In another embodiment, the encapsulation portion may include a thin film encapsulation layer E that is arranged on the counter electrode 28-3 and shields the counter electrode 28-3. In the following description, for convenience of explanation, a case in which the encapsulation portion includes the thin film encapsulation layer E is mainly described in detail.

The thin film encapsulation layer E may include a plurality of inorganic layers, or an inorganic layer and an organic layer.

The organic layer of the thin film encapsulation layer E is formed of a polymer, or may be a single layer or a laminated layer formed of any one of polyethylene terephthalate, polyimide, polycarbonate, epoxy, polyethylene, and polyacrylate. Furthermore, the organic layer may be formed of polyacrylate, and in detail may include polymerized monomer compositions including diacrylate monomers and triacrylate monomers. Monoacrylate monomer may be further included in the monomer composition. Furthermore, the monomer composition may further include a well-known photoinitiator such as TPO, but the present disclosure is not limited thereto.

The inorganic layer of the thin film encapsulation layer E may be a single layer or a laminated layer including a metal oxide or a metal nitride. In detail, the inorganic layer may include any one of SiNx, $Al_2O_3$, $SiO_2$, and $TiO_2$.

The top layer of the thin film encapsulation layer E exposed to the outside may be formed of an inorganic layer to prevent intrusion of moisture into the OLED.

The thin film encapsulation layer E may include at least one sandwich structure in which at least one organic layer is inserted between at least two inorganic layers. In another example, the thin film encapsulation layer E may include at least one sandwich structure in which at least one inorganic layer is inserted between at least two organic layers. In another example, the thin film encapsulation layer E may include may include at least one sandwich structure in which at least one organic layer is inserted between at least two inorganic layers and at least one sandwich structure in which at least one inorganic layer is inserted between at least two organic layers.

The thin film encapsulation layer E may include a first inorganic layer, a first organic layer, and a second inorganic layer sequentially above the OLED 28.

In another example, the thin film encapsulation layer E may include a first inorganic layer, a first organic layer, a second inorganic layer, a second organic layer, and a third inorganic layer sequentially above the OLED 28.

In another example, the thin film encapsulation layer E may include a first inorganic layer, a first organic layer, a second inorganic layer, a second organic layer, a third inorganic layer, a third organic layer, and a fourth inorganic layer sequentially above the OLED 28.

A halogenated metal layer including LiF may be further included between the OLED 28 and the first inorganic layer. The halogenated metal layer may prevent the OLED 28 from being damaged when the first inorganic layer is formed by a sputtering method.

The first organic layer may have an area less than the second inorganic layer, and the second organic layer may have an area less than the third inorganic layer.

Accordingly, since the display apparatus 20 includes the intermediate layer 28-2 that is almost similar to the design value, a high-accuracy image may be realized.

As described above, in the apparatus for manufacturing a display apparatus and the method of manufacturing a display apparatus according to the present embodiments, the intermediate layers of various shapes may be formed.

In the apparatus for manufacturing a display apparatus and the method of manufacturing a display apparatus according to the present embodiments, the intermediate layer may be precisely formed.

In the apparatus for manufacturing a display apparatus and the method of manufacturing a display apparatus according to the present embodiments, a high-resolution display apparatus may be manufactured.

It should be understood that embodiments described herein should be considered in a descriptive sense only and not for purposes of limitation. Descriptions of features or aspects within each embodiment should typically be considered as available for other similar features or aspects in other embodiments.

While one or more embodiments have been described with reference to the figures, it will be understood by those of ordinary skill in the art that various changes in form and details may be made therein without departing from the spirit and scope as defined by the following claims.

What is claimed is:

1. A method of manufacturing a display apparatus, the method comprising:
    arranging a first display substrate and a second display substrate in a chamber;
    arranging a mask assembly to correspond to each of the first display substrate and the second display substrate;
    aligning the mask assembly corresponding to one of the first display substrate and the second display substrate with one of the first display substrate and the second display substrate; and
    supplying at least two deposition materials to the mask assembly through a deposition source comprising a plurality of crucibles within the chamber, and allowing the at least two deposition materials having passed through the mask assembly to be deposited on one of the first display substrate and the second display substrate, there being a separate angle limiting plate for each of the plurality of crucibles, wherein the angle limiting plate has different portions disposed on different parts of each of the crucibles and adjusts an ejection angle of the deposition material ejected from the crucible,
    wherein an amount of the at least two deposition materials is adjusted by controlling an amount of a deposition material ejected from each of the plurality of crucibles through a shutter portion or by controlling an amount of a deposition material supplied to each of the plurality of crucibles through a cut-off portion, and
    wherein the controlling an amount of a deposition material ejected from each of the plurality of crucibles through a shutter portion comprises:
    calculating an evaporation rate of the deposition material by measuring an internal pressure and an internal temperature of each of the plurality of crucibles with a sensor portion provided directly on each of the plurality of crucibles, the deposition material being in direct contact with the plurality of crucibles;
    comparing the evaporation rate to a preset evaporation rate; and
    adjusting a degree of opening of the shutter portion based on the comparing.

2. The method of claim 1, wherein the deposition material is deposited on at least one of the first display substrate and the second display substrate that are arranged perpendicular to a lower surface of the chamber.

3. The method of claim 2, wherein the first display substrate and the second display substrate are arranged to face each other.

4. The method of claim 1, wherein the shutter portion is arranged between the mask assembly and the deposition source and performs a linear motion.

5. The method of claim 1, wherein a plurality of deposition material supply portions for separately supplying a deposition material to each of the plurality of crucibles are connected to the deposition source, and the cut-off portion controls an amount of the deposition material supplied from each of the plurality of deposition material supply portions to each of the plurality of crucibles.

6. The method of claim 1, wherein the deposition source performs a linear motion.

7. The method of claim 1, wherein, while the at least two deposition materials are deposited on one of the first display substrate and the second display substrate, the other of the first display substrate and the second display substrate is positionally aligned with the mask assembly.

8. The method of claim 1, wherein the shutter portion is disposed adjacent to the deposition source and performs a rotation motion.

9. The method of claim 1, wherein at least one of the plurality of crucibles has a limited ejection angle of the deposition material ejected therefrom.

10. The method of claim 1, wherein the at least two deposition materials are deposited on the other of the first display substrate and the second display substrate by changing a direction of the deposition source.

11. The method of claim 1, wherein the at least two deposition materials are different materials from each other.

12. The method of claim 1, wherein a cooling jacket encompasses the plurality of crucibles and the sensor portion.

13. The method of claim 1, wherein the evaporation rate is calculated based on the following equation:

$$N = \frac{A \times \alpha \times (P^* - P)}{\sqrt{2\pi \times m \times kg \times T}},$$

where "N" denotes the evaporation rate, "A" denotes a surface area in which the deposition material evaporates, "a" denotes an adsorption coefficient, "T" denotes the internal temperature, "P*" denotes a saturation vapor pressure of the deposition material at the internal temperature, "P" denotes the internal pressure, "m" denotes mass of the deposition material, and "$k_B$" denotes a Boltzmann's constant.

* * * * *